United States Patent
Chen et al.

(10) Patent No.: US 9,649,712 B2
(45) Date of Patent: May 16, 2017

(54) APPARATUS AND METHOD FOR STRIPPING SOLDER METALS DURING THE RECYCLING OF WASTE ELECTRICAL AND ELECTRONIC EQUIPMENT

(71) Applicant: Advanced Technology Materials, Inc., Danbury, CT (US)

(72) Inventors: Tianniu Chen, Westford, MA (US); Michael B. Korzenski, Bethel, CT (US); Ping Jiang, Danbury, CT (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 14/803,936

(22) Filed: Jul. 20, 2015

(65) Prior Publication Data

US 2015/0322545 A1 Nov. 12, 2015

Related U.S. Application Data

(62) Division of application No. 14/240,220, filed as application No. PCT/US2012/069404 on Dec. 13, 2012.

(Continued)

(51) Int. Cl.
*B23K 31/02* (2006.01)
*B23K 1/018* (2006.01)
(Continued)

(52) U.S. Cl.
CPC .......... *B23K 1/018* (2013.01); *B09B 3/00* (2013.01); *B09B 5/00* (2013.01); *B23K 3/08* (2013.01); *B23K 37/00* (2013.01); *C22B 1/005* (2013.01); *C22B 3/02* (2013.01); *C22B 3/04* (2013.01); *C22B 4/00* (2013.01); *C22B 7/006* (2013.01); *C22B 11/046* (2013.01); *C25C 1/00* (2013.01);
(Continued)

(58) Field of Classification Search
None
See application file for complete search history.

(56) References Cited

U.S. PATENT DOCUMENTS

| 873,583 A | 12/1907 | Nichols |
| 1,362,381 A * | 12/1920 | Zacharias ............ C22B 25/06 266/204 |

(Continued)

FOREIGN PATENT DOCUMENTS

| CN | 1070536 A | 3/1993 |
| CN | 1858277 A | 11/2006 |

(Continued)

OTHER PUBLICATIONS

Machine translation of CN 101260469 A (no date available).*

(Continued)

*Primary Examiner* — Kiley Stoner
(74) *Attorney, Agent, or Firm* — Entegris, Inc. Legal Dept.; Nidhi G. Kissoon; John E. Pillion

(57) ABSTRACT

Apparatuses and processes for recycling printed wire boards, wherein electronic components, precious metals and base metals may be collected for reuse and recycling. The apparatuses generally include a mechanical solder removal module and/or a thermal module, a chemical solder removal module, and a precious metal leaching module, wherein the modules are attached for continuous passage of the e-waste from module to module.

30 Claims, 8 Drawing Sheets

Related U.S. Application Data

(60) Provisional application No. 61/589,583, filed on Jan. 23, 2012, provisional application No. 61/576,035, filed on Dec. 15, 2011.

(51) Int. Cl.

| | | |
|---|---|---|
| *C25C 1/00* | (2006.01) | |
| *C22B 3/02* | (2006.01) | |
| *C22B 3/00* | (2006.01) | |
| *C22B 7/00* | (2006.01) | |
| *C22B 1/00* | (2006.01) | |
| *C22B 4/00* | (2006.01) | |
| *C22B 3/04* | (2006.01) | |
| *B23K 3/08* | (2006.01) | |
| *B23K 37/00* | (2006.01) | |
| *B09B 3/00* | (2006.01) | |
| *B09B 5/00* | (2006.01) | |
| *H05K 3/22* | (2006.01) | |

(52) U.S. Cl.
CPC ......... *H05K 3/22* (2013.01); *H05K 2203/178* (2013.01); *Y02P 10/234* (2015.11); *Y02P 70/613* (2015.11); *Y02W 30/82* (2015.05); *Y02W 30/821* (2015.05); *Y02W 30/822* (2015.05)

(56) References Cited

U.S. PATENT DOCUMENTS

| | | | | |
|---|---|---|---|---|
| 1,527,076 A * | 2/1925 | Peck | ............ | B04B 5/00 266/204 |
| 1,750,364 A * | 3/1930 | Schmucking | ............ | B04B 3/00 210/377 |
| 1,826,755 A | 10/1931 | Morecraft et al. | | |
| 1,858,669 A * | 5/1932 | Hinchley | ............ | C22B 25/06 423/90 |
| 1,861,878 A * | 6/1932 | Quiroz | ............ | B04B 5/02 209/451 |
| 2,233,213 A * | 2/1941 | Kniseley | ............ | C09J 189/005 34/443 |
| 2,704,707 A * | 3/1955 | Lemeshka | ............ | B23K 35/00 228/234.2 |
| 3,399,090 A | 8/1968 | Caropreso et al. | | |
| 3,498,303 A * | 3/1970 | Eaves | ............ | H05K 3/26 118/75 |
| 3,625,763 A | 12/1971 | Melillo | | |
| 3,644,150 A | 2/1972 | Oomen et al. | | |
| 3,644,155 A | 2/1972 | Hogya et al. | | |
| 3,866,893 A * | 2/1975 | Hoberman | ............ | B23K 1/0002 266/120 |
| 3,935,125 A | 1/1976 | Jacob | | |
| 3,947,351 A | 3/1976 | Asawa et al. | | |
| 3,953,265 A * | 4/1976 | Hood | ............ | H01L 21/6708 156/345.16 |
| 3,957,505 A | 5/1976 | Homick et al. | | |
| 3,984,090 A * | 10/1976 | Swartz | ............ | C22B 1/005 266/227 |
| 4,021,278 A * | 5/1977 | Hood | ............ | H01L 21/30 134/902 |
| 4,070,182 A | 1/1978 | Genik-Sas-Berezowsky et al. | | |
| 4,227,922 A * | 10/1980 | Laws | ............ | C22B 7/004 75/10.67 |
| 4,261,738 A | 4/1981 | Valentine et al. | | |
| 4,269,622 A | 5/1981 | Kerley, Jr. | | |
| 4,270,260 A * | 6/1981 | Krueger | ............ | H01L 24/75 219/411 |
| 4,315,042 A * | 2/1982 | Spigarelli | ............ | B23K 1/015 118/72 |
| 4,369,061 A | 1/1983 | Kerley, Jr. | | |
| 4,374,744 A | 2/1983 | Kawanabe et al. | | |
| 4,401,522 A * | 8/1983 | Buschow | ............ | C25D 5/02 204/203 |
| 4,426,225 A | 1/1984 | Ida et al. | | |
| 4,426,251 A | 1/1984 | Ida et al. | | |
| 4,437,928 A | 3/1984 | Wong | | |
| 4,462,879 A * | 7/1984 | Castellanos | ............ | C25C 1/20 205/723 |
| 4,501,770 A * | 2/1985 | Bajka | ............ | B23K 1/018 427/347 |
| 4,541,358 A * | 9/1985 | Spigarelli | ............ | B23K 1/015 118/423 |
| 4,637,865 A * | 1/1987 | Sergent | ............ | C22B 3/1666 205/569 |
| 4,654,078 A | 3/1987 | Perez et al. | | |
| 4,661,180 A * | 4/1987 | Frushour | ............ | B32B 19/04 156/89.25 |
| 4,668,289 A | 5/1987 | Langer et al. | | |
| 4,678,552 A | 7/1987 | Chen | | |
| 4,713,144 A | 12/1987 | Schiller | | |
| 4,799,616 A | 1/1989 | Simpson et al. | | |
| 4,855,572 A * | 8/1989 | Wallgren | ............ | B23K 1/018 219/209 |
| 4,913,730 A | 4/1990 | Deschenes et al. | | |
| 4,919,220 A * | 4/1990 | Fuller | ............ | E21B 10/60 175/433 |
| 4,921,571 A | 5/1990 | Kukanskis et al. | | |
| 4,938,257 A * | 7/1990 | Morris | ............ | H05K 3/0085 134/105 |
| 4,944,851 A | 7/1990 | Cordani et al. | | |
| 4,957,653 A | 9/1990 | Cordani | | |
| 5,017,267 A | 5/1991 | Cordani | | |
| 5,035,749 A | 7/1991 | Haruta et al. | | |
| 5,137,700 A | 8/1992 | Sloan | | |
| 5,190,578 A | 3/1993 | Feldman | | |
| 5,217,171 A | 6/1993 | Feldman | | |
| 5,221,421 A * | 6/1993 | Leibovitz | ............ | C22B 11/046 156/345.18 |
| 5,223,023 A * | 6/1993 | Awadalla | ............ | C22B 3/16 75/741 |
| 5,244,539 A | 9/1993 | McGrath et al. | | |
| 5,279,803 A | 1/1994 | Clough | | |
| 5,348,588 A | 9/1994 | Winston | | |
| 5,389,124 A | 2/1995 | Nakao | | |
| 5,402,563 A | 4/1995 | Satoh et al. | | |
| 5,405,430 A | 4/1995 | Groves et al. | | |
| 5,458,281 A | 10/1995 | Downing et al. | | |
| 5,512,201 A | 4/1996 | Singh et al. | | |
| 5,520,205 A * | 5/1996 | Guldi | ............ | H01L 21/67057 134/102.1 |
| 5,520,794 A | 5/1996 | Gernon | | |
| 5,542,957 A * | 8/1996 | Han | ............ | B01J 37/0036 205/570 |
| 5,552,579 A | 9/1996 | Krueger | | |
| 5,630,554 A | 5/1997 | Izumikawa et al. | | |
| 5,672,212 A * | 9/1997 | Manos | ............ | H01L 21/67023 134/1.3 |
| 5,683,040 A | 11/1997 | Jakob et al. | | |
| 5,707,585 A * | 1/1998 | Ward | ............ | B23K 3/08 222/592 |
| 5,715,592 A * | 2/1998 | Mori | ............ | H05K 13/0486 228/191 |
| 5,735,450 A * | 4/1998 | Heim | ............ | B23K 1/012 228/191 |
| 5,755,889 A * | 5/1998 | Johnson | ............ | C22B 13/025 266/227 |
| 5,755,950 A | 5/1998 | Bell | | |
| 5,901,898 A * | 5/1999 | Strempke | ............ | B23K 1/018 228/19 |
| 5,928,529 A | 7/1999 | Campbell | | |
| 5,938,956 A * | 8/1999 | Hembree | ............ | H01L 21/50 174/538 |
| 5,979,033 A * | 11/1999 | Chang | ............ | B03B 9/061 241/23 |
| 5,980,841 A | 11/1999 | Yamamoto | | |
| 5,989,449 A | 11/1999 | Campbell | | |
| 6,083,848 A * | 7/2000 | Sugasawara | ............ | B23K 1/018 134/1.2 |
| 6,227,434 B1 | 5/2001 | Bassi et al. | | |
| 6,235,208 B1 | 5/2001 | Kawashima et al. | | |

(56) References Cited

U.S. PATENT DOCUMENTS

| | | | |
|---|---|---|---|
| 6,258,294 B1 | 7/2001 | Johnson, II et al. | |
| 6,271,048 B1 | 8/2001 | Reilich et al. | |
| 6,276,589 B1* | 8/2001 | Watts, Jr. | B23K 3/0607 |
| | | | 118/300 |
| 6,423,148 B1* | 7/2002 | Aoki | C11D 7/06 |
| | | | 134/28 |
| 6,455,018 B1 | 9/2002 | Cuif | |
| 6,638,363 B2 | 10/2003 | Erdmann | |
| 6,641,712 B1 | 11/2003 | Gibson et al. | |
| 6,666,370 B2* | 12/2003 | McDonald | B23K 3/06 |
| | | | 228/203 |
| 6,675,454 B1 | 1/2004 | Marschner | |
| 6,716,290 B1 | 4/2004 | Rosser et al. | |
| 6,875,254 B2* | 4/2005 | Furlong | G01N 33/24 |
| | | | 209/162 |
| 6,948,650 B2 | 9/2005 | Howell et al. | |
| 6,986,192 B2 | 1/2006 | Fitch | |
| 7,067,090 B2 | 6/2006 | Han et al. | |
| 7,166,145 B1 | 1/2007 | Han | |
| 7,285,229 B2 | 10/2007 | Kuriyama et al. | |
| 7,316,062 B2* | 1/2008 | Chilcote | B23K 1/0016 |
| | | | 228/180.21 |
| 7,473,406 B2 | 1/2009 | Jasra et al. | |
| 7,513,931 B2 | 4/2009 | Thomas | |
| 7,703,197 B2 | 4/2010 | Moltion | |
| 7,740,684 B2 | 6/2010 | Xu | |
| 7,786,401 B2 | 8/2010 | Valerio | |
| 7,886,422 B1* | 2/2011 | Zhou | B23K 1/018 |
| | | | 156/73.3 |
| 7,902,262 B2 | 3/2011 | Armstrong et al. | |
| 7,972,413 B2 | 7/2011 | Xia | |
| 8,039,382 B2 | 10/2011 | Fang et al. | |
| 8,101,518 B2 | 1/2012 | Cabral, Jr. et al. | |
| 8,486,281 B2 | 7/2013 | Feng et al. | |
| 8,814,980 B2 | 8/2014 | Drinkard, Jr. et al. | |
| 9,150,942 B2 | 10/2015 | Xia | |
| 9,221,114 B2 | 12/2015 | Chen et al. | |
| 2001/0030251 A1 | 10/2001 | Ueno et al. | |
| 2002/0134408 A1* | 9/2002 | Christison | B08B 3/047 |
| | | | 134/26 |
| 2002/0162579 A1* | 11/2002 | Wang | H01L 21/67086 |
| | | | 134/26 |
| 2002/0162880 A1* | 11/2002 | Jackson | B08B 1/008 |
| | | | 228/264 |
| 2003/0019761 A1* | 1/2003 | Jaworowski | B23K 1/018 |
| | | | 205/640 |
| 2003/0037804 A1 | 2/2003 | Erdmann | |
| 2003/0132416 A1 | 7/2003 | Boguslavsky et al. | |
| 2004/0011850 A1* | 1/2004 | Bayot | B23K 3/00 |
| | | | 228/19 |
| 2004/0081602 A1 | 4/2004 | Han et al. | |
| 2004/0103512 A1* | 6/2004 | Fitch | B03B 9/061 |
| | | | 29/403.3 |
| 2004/0155096 A1* | 8/2004 | Zimmerman | B23K 3/06 |
| | | | 228/248.1 |
| 2004/0179985 A1* | 9/2004 | Olper | C22B 3/10 |
| | | | 423/23 |
| 2004/0181923 A1 | 9/2004 | Dills | |
| 2004/0187642 A1* | 9/2004 | Boetje | C22B 7/004 |
| | | | 75/401 |
| 2004/0213715 A1* | 10/2004 | Lucien | C22B 11/08 |
| | | | 423/40 |
| 2004/0219082 A1 | 11/2004 | Matjie et al. | |
| 2004/0231794 A1* | 11/2004 | Hongo | B08B 3/02 |
| | | | 156/345.12 |
| 2005/0040139 A1* | 2/2005 | Gonzalez | C23F 1/20 |
| | | | 216/83 |
| 2005/0087371 A1* | 4/2005 | Kembaiyan | B23B 27/148 |
| | | | 175/435 |
| 2005/0089440 A1* | 4/2005 | Kembaiyan | B23B 27/148 |
| | | | 420/502 |
| 2005/0262967 A1* | 12/2005 | Leon | C22B 7/004 |
| | | | 75/401 |
| 2007/0054106 A1 | 3/2007 | Armstrong et al. | |
| 2007/0169330 A1* | 7/2007 | Wu | B29B 17/02 |
| | | | 29/403.3 |
| 2007/0218590 A1* | 9/2007 | Kameyama | C25D 5/10 |
| | | | 438/123 |
| 2007/0253179 A1* | 11/2007 | Briggs | H05K 3/305 |
| | | | 361/808 |
| 2008/0121621 A1 | 5/2008 | Stockum et al. | |
| 2008/0206960 A1 | 8/2008 | Dang et al. | |
| 2008/0282844 A1* | 11/2008 | Xu | B03B 9/061 |
| | | | 75/707 |
| 2009/0127321 A1* | 5/2009 | Gottshall | H05K 3/3468 |
| | | | 228/264 |
| 2009/0272227 A1 | 11/2009 | Creasey et al. | |
| 2010/0071507 A1* | 3/2010 | Lee | C22B 7/005 |
| | | | 75/10.67 |
| 2010/0101367 A1* | 4/2010 | Muratani | C22B 3/46 |
| | | | 75/10.67 |
| 2010/0181205 A1 | 7/2010 | Thpmas | |
| 2010/0187732 A1* | 7/2010 | Inuma | B23K 3/08 |
| | | | 266/227 |
| 2010/0300865 A1* | 12/2010 | Wu | B29B 17/02 |
| | | | 201/10 |
| 2011/0024201 A1* | 2/2011 | Scott | B22F 7/004 |
| | | | 175/428 |
| 2011/0147501 A1 | 6/2011 | Valerio | |
| 2011/0182786 A1 | 7/2011 | Burba, III | |
| 2011/0220554 A1 | 9/2011 | Thomas et al. | |
| 2011/0230689 A1 | 9/2011 | Scheirs | |
| 2011/0240716 A1 | 10/2011 | Zinn et al. | |
| 2011/0274598 A1 | 11/2011 | Akridge | |
| 2012/0000999 A1 | 1/2012 | Koslow | |
| 2012/0031566 A1 | 2/2012 | Meloni | |
| 2012/0067169 A1 | 3/2012 | Butler | |
| 2012/0090433 A1 | 4/2012 | Butler | |
| 2012/0266459 A1* | 10/2012 | Bessette | B23K 1/018 |
| | | | 29/825 |
| 2012/0274008 A1* | 11/2012 | Akridge | C22B 3/02 |
| | | | 266/170 |
| 2012/0292201 A1 | 11/2012 | Hsu | |
| 2013/0000532 A1* | 1/2013 | Rabiner | F23G 5/02 |
| | | | 110/346 |
| 2013/0168159 A1* | 7/2013 | Eyre | E21B 10/46 |
| | | | 175/432 |
| 2013/0174694 A1 | 7/2013 | Xu | |
| 2013/0276284 A1* | 10/2013 | Brosseau | C22B 7/007 |
| | | | 29/426.1 |
| 2013/0326850 A1 | 12/2013 | Xu | |
| 2013/0336857 A1* | 12/2013 | Korzenski | C22B 3/0005 |
| | | | 423/27 |
| 2014/0026713 A1* | 1/2014 | Bezuidenhout | C22B 1/02 |
| | | | 75/338 |
| 2014/0084422 A1* | 3/2014 | Dolukhanyan | H01L 21/02617 |
| | | | 257/618 |
| 2014/0165786 A1* | 6/2014 | Dedek | C22B 3/24 |
| | | | 75/715 |
| 2014/0217157 A1* | 8/2014 | Brosseau | B23K 1/018 |
| | | | 228/264 |
| 2014/0243249 A1 | 8/2014 | Hsu | |
| 2015/0068363 A1* | 3/2015 | Almeida | C22B 7/003 |
| | | | 75/401 |
| 2015/0114182 A1* | 4/2015 | Parkes | C22B 7/006 |
| | | | 75/715 |

FOREIGN PATENT DOCUMENTS

| | | | | |
|---|---|---|---|---|
| CN | 101260469 A | * | 9/2008 | |
| CN | 101270411 A | | 9/2008 | |
| CN | 101537522 A | | 9/2009 | |
| CN | 101623698 A | | 1/2010 | |
| CN | 201895152 U | | 7/2011 | |
| DE | 19715319 A1 | | 10/1998 | |
| EP | 0124213 A1 | | 2/1984 | |
| EP | 0541071 A1 | * | 5/1993 | B23B 27/145 |
| EP | 1457577 A1 | | 9/2004 | |
| EP | 1811821 A | * | 7/2007 | |
| EP | 1811821 A1 | | 7/2007 | |

(56) References Cited

FOREIGN PATENT DOCUMENTS

| | | | |
|---|---|---|---|
| GB | 873583 | | 7/1961 |
| JP | 03031494 A | * | 2/1991 |
| JP | 05140769 A | * | 6/1993 |
| JP | 09316549 A | | 12/1997 |
| JP | 10183264 A | | 7/1998 |
| JP | 63215372 | | 9/1998 |
| JP | 10314713 A | | 12/1998 |
| JP | 1176980 A | * | 4/1999 |
| JP | 2002233856 A | * | 8/2002 |
| JP | 2003003218 A | | 1/2003 |
| JP | 2007092138 A | | 4/2007 |
| JP | 2010168625 A | | 8/2010 |
| KR | 0145346 B1 | | 8/1998 |
| KR | 20020022856 A | | 3/2002 |
| KR | 20030006792 A | | 1/2003 |
| PL | 158889 B1 | * | 10/1992 |
| TW | I250180 B | | 3/2006 |
| TW | KR 20070077114 A | * | 7/2007 ............ B29B 17/02 |
| TW | 200727998 A | | 8/2007 |
| WO | 8706274 A1 | | 10/1987 |
| WO | 0043574 A1 | | 7/2000 |
| WO | 2006013568 A2 | | 2/2006 |
| WO | WO 2011/130622 A1 | * | 10/2011 |

OTHER PUBLICATIONS

NEC launches the 'Ecoseparation System' (Jan. 1997).*
International Search Report, Mar. 28, 2013.
Chinese Office Action, Jul. 2, 2014.
International Search Report and Written Opinion, Jul. 22, 2011.
Angelidis, T.N., et al.; "Selective gold dissolution from a roasted auriferous pyrite-arsenopyrite concentration," Hydrometallurgy, 1995, pp. 75-88, vol. 37.
Antonijevic, M.M., et al.; "Copper Corrosion Inhibitors. A review," International Journal of Electrochemical Science, 2008, pp. 1-28, vol. 3.
Coombs, Clyde, Printed Circuits Handbook, 2007, McGraw-Hill Professional, 6th Edition, pp. 1000, Review of Front Cover Only, as This is a Book.
Gammons, Christopher H., et al; "The disproportionation of gold (I) chloride complexes at 25 to 200 degrees Celsius," Geochimica et Cosmochimica Acta, 1997, pp. 1971-1983, vol. 61.
Gernon, Michael D., et al.; "Environmental benefits of methanesulfonic acid: Comparative properties and advantages," Green Chemistry, 1999, pp. 127-140.
Henglein, Arnim, "Chemical effects of continuous and pulsed ultrasound in aqueous solutions," Ultrasonics Sonochemistry, 1995, pp. 115-121, vol. 2.
Kerr, Charlie; "Sustainable technologies for the regeneration of acidic tin stripping solutions used in PCB fabrication," Circuit World, 2004, 51-58, vol. 30/3, Abstract Only.
Leighton, T.G., The Acoustic Bubble, 1994, Academic Press, pp. 613, Review of Front Cover Only, as This is a Book.
Mecucci, Andrea, et al.; "Leaching and electrochemical recovery of copper, lead and tin from scrap printed circuit boards," Journal of Chemical Technology and Biotechnology, 2002, pp. 449-457, vol. 77.
Quinet, P. et al.; "Recovery of precious metals from electronic scrap by hydrometallurgical processing routes," Minerals & Metallurgical Processing, 2005, pp. 17-22, vol. 22, Abstract Only.
Scott, K. et al.; "Elecrochemical recycling of tin, lead and copper from stripping solution in the manufacture of circuit boards," Resources, Conservation and Recycling, 1997, pp. 43-55, vol. 20.
Shaigan, N. et al.; "A highly stabilized-inhibited nitric acid/ferric nitrate-based solder stripping solution," Journal of Applied Electrochemistry, 2006, pp. 1043-1049, vol. 36.
Sheng, Peter P., et al.; "Recovery of gold from computer circuit board scrap using aqua regia," Waste Manage Res., 2007, pp. 380-383, vol. 25.
Stennett, A.D.; "Novel rework techniques for electronic assemblies," Proceedings of the Electronic Packaging Technology Conference, EPTC 1998 IEEE, pp. 196-201.
Stennett, A.D., et al.; "Novel techniques for electronic component removal," Soldering & Surface Mount Technology, 1999, 7-11, 11/2, Abstract Only.
Syed, S., "A green technology for recovery of gold from non-metallic secondary sources," Hydrometallurgy, 2006, pp. 48-53, vol. 82.
Gladyshev, S.V., et al.; Russion Journal of General Chemistry, 2000, vol. 70, p. 1429, Not Attached as This Article Could not be Located.
Suslick, K.S., Kirk-Othmer Encyclopedia of Chemical Technology, 4th Edition, 1998, J. Wiley & Sons, New York, pp. 517-541, vol. 26, Reference Could not be Located.
Moleux, P.G., A case study and update using diffusion dialysis to purify acid in a plant that fabricates PCBs, Proc. 89th Annual Meeting, Air and Waste Management Association, 1996, Reference Could not be Located.
Brandon, N.P.; "Metal Recovery From Electronic Scrap by Leaching and Electrowinning," Electrochemical Society Meeting, Sep. 2001, pp. 1-17.
Korean Office Action, Apr. 17, 2015.
Chinese Office Action, Apr. 30, 2015.
Altmayer, F., et al.; "The Effect of Barrel Design on Drag-out," Plating and Finishing, Feb. 2002, pp. 32-37.
European Search Report, Jun. 5, 2015.
Jiang, P., et al.; "Improving the end-of-Life for electronic materials via sustainable recycling methods," Procedia Environmental Sciences, vol. 16, pp. 485-490, 2012.
"Reviewing the Operation of Gold Electrowinning Cells," RenoCell Technical Bulletin, RRII-110010-0, Renovare International, Inc., Jun. 28, 2011, pp. 1-33.
Umeda, H., et al.; "Recovery and Concentration of Precious Metals from Strong Acidic Wastewater," Materials Transactions, 2011, pp. 1462-1470, vol. 52.
IBM; Lawerence, JG; "Surface-Mounted Component Desoldering Tool," ip.com; 1986, pp. 1-3.
Dhinest Office Action, Jan. 12, 2016.
Taiwanese Office Action, Apr. 15, 2016.
Translation of Office Action, TW Application 101147400, mailed Nov. 28, 2016, 3 pages.

* cited by examiner

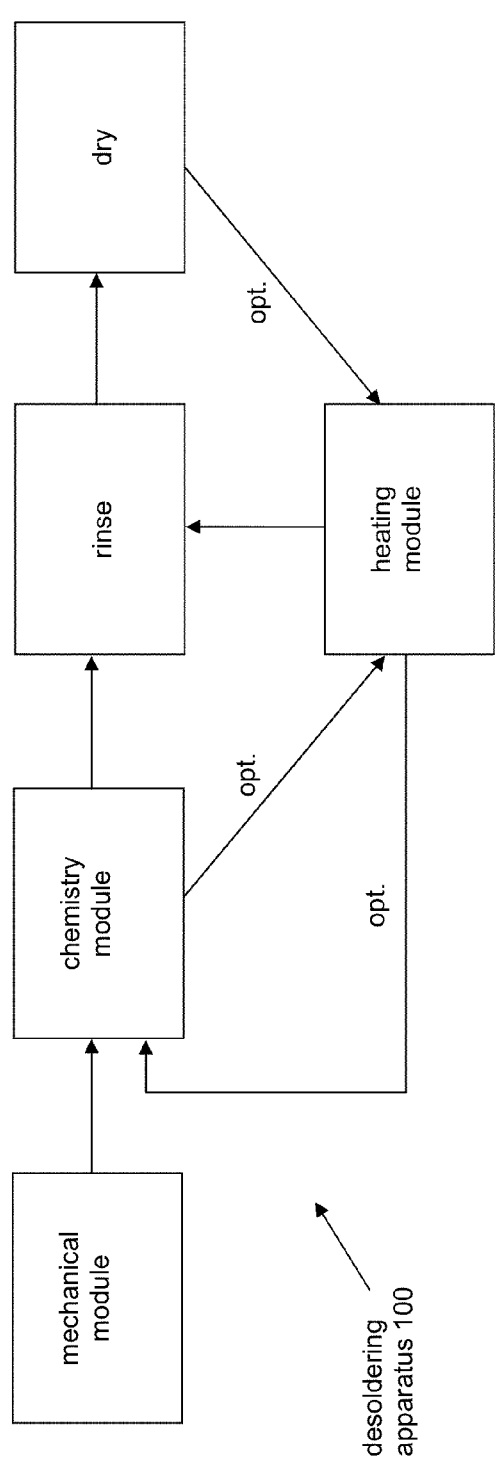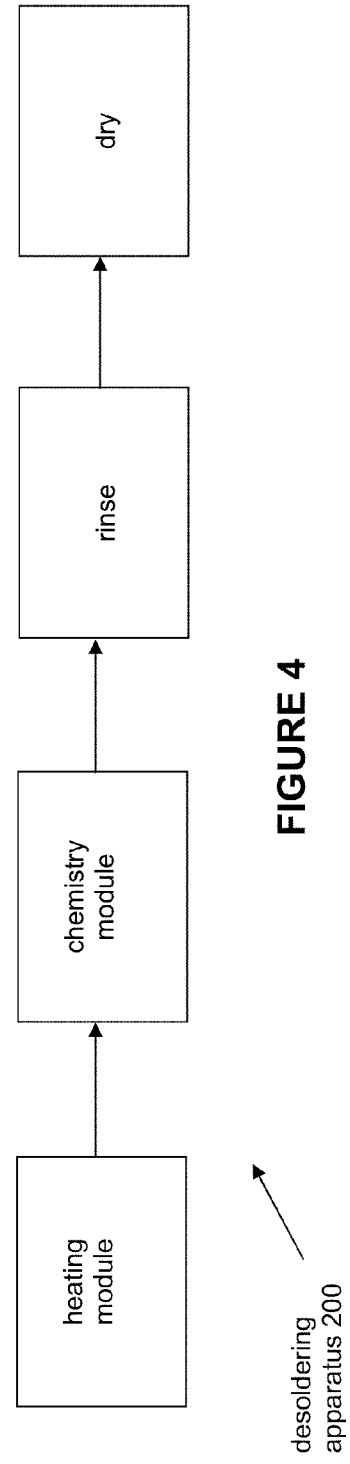

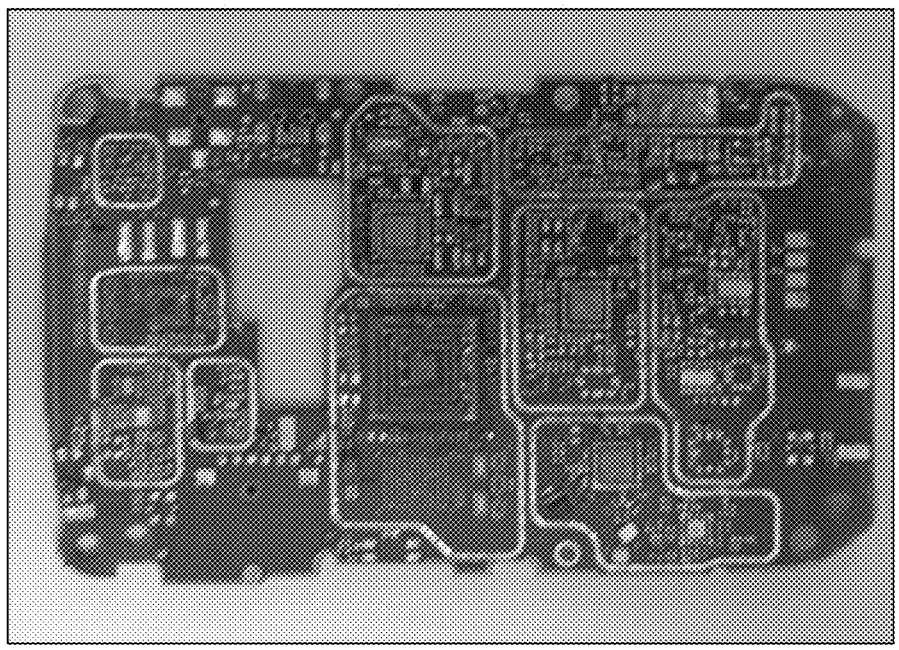
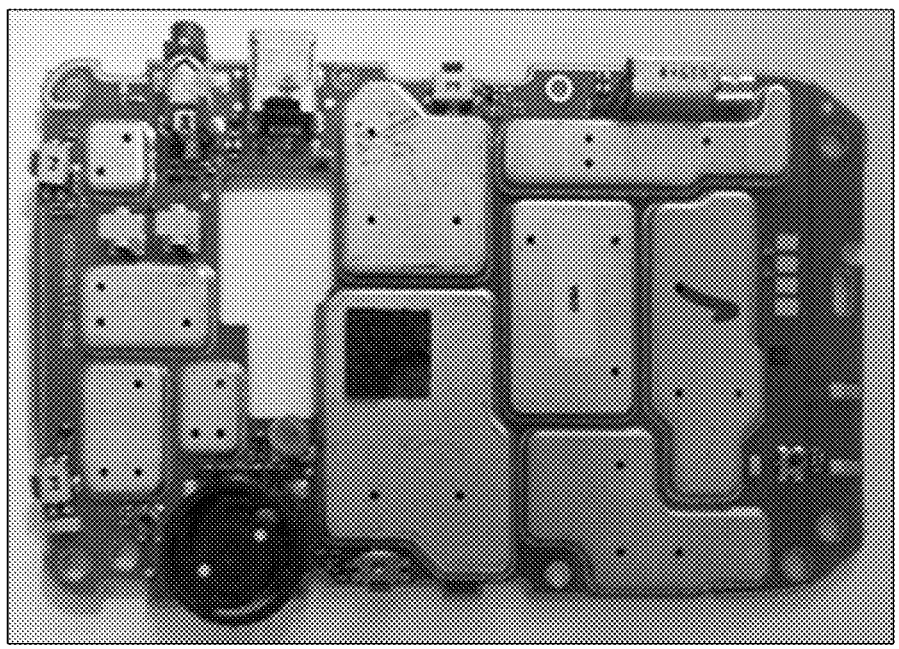
FIGURE 10

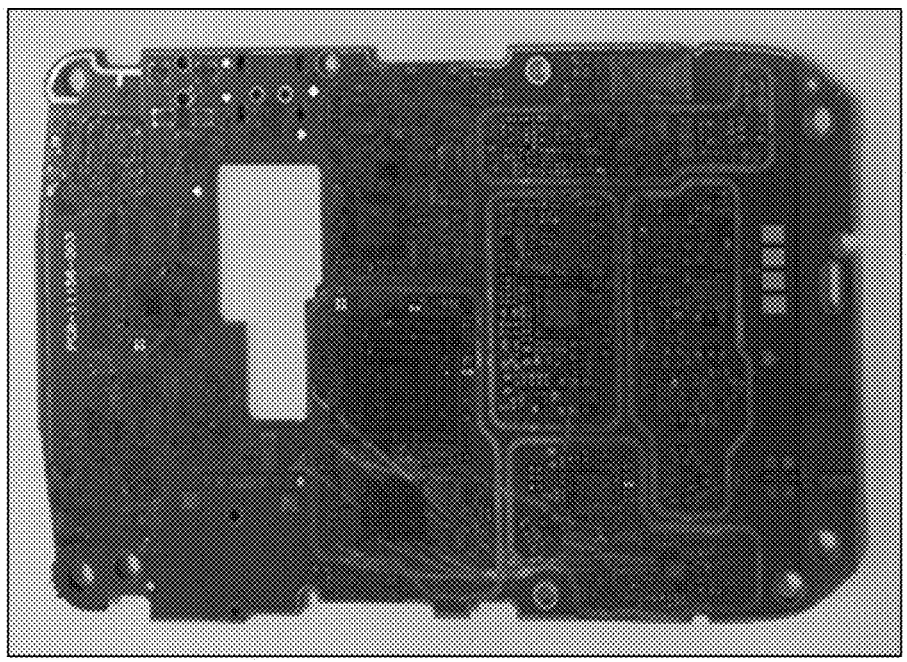
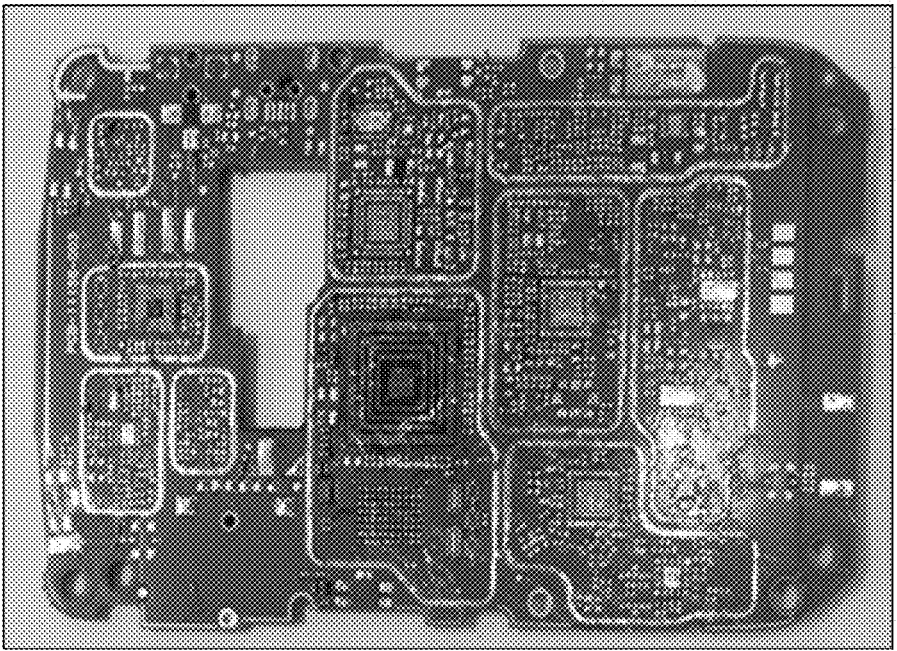
FIGURE 11

APPARATUS AND METHOD FOR STRIPPING SOLDER METALS DURING THE RECYCLING OF WASTE ELECTRICAL AND ELECTRONIC EQUIPMENT

CROSS-REFERENCE TO RELATED APPLICATIONS

This application is filed under the provisions of 35 U.S.C. §121 and is a divisional of U.S. patent application Ser. No. 14/240,220, filed on Feb. 21, 2014, entitled "APPARATUS AND METHOD FOR STRIPPING SOLDER METALS DURING THE RECYCLING OF WASTE ELECTRICAL AND ELECTRONIC EQUIPMENT" in the name of Tianniu Chen, et al., which was filed under 35 U.S.C. §371 and claims the priority of International Patent Application No. PCT/US2012/069404 filed on 13 Dec. 2012, which claims priority to U.S. Provisional Patent Application Nos. 61/576,035, filed on 15 Dec. 2011, and 61/589,583, filed on 23 Jan. 2012, all of which are hereby incorporated by reference herein in their entirety.

FIELD

The present invention relates generally to apparatuses and processes for recycling waste electrical and electronic equipment such as printed wire boards to separate materials including, but not limited to, precious metals, base metals, solder metals, and working integrated circuits.

DESCRIPTION OF THE RELATED ART

Disposal of used electronic equipment including obsolete or damaged computers, computer monitors, television receivers, cellular telephones, and similar products, is increasing at a rapid rate. It is recognized that there are significant hazards to living things and to the environment generally when electronic equipment is dumped in landfills. Equally, it is understood that improper disassembly poses appreciable risks to the health and safety of people performing disassembly manually.

Printed wire boards (PWBs) are a common element of many electronic systems. PWBs are typically manufactured by laminating dry film on clean copper foil, which is supported on a fiberglass plate matrix. The film is exposed with a film negative of the circuit board design, and an etcher is used to remove unmasked copper foil from the plate. Solder is then applied over the unetched copper on the board. Depending upon the use and design of the particular PWB, various other metals may be used in the manufacturing process, including lead, tin, nickel, iron, zinc, aluminum, silver, gold, platinum, palladium, and mercury. The PWBs include many additional components, for example, transistors, capacitors, heat sinks, integrated circuits (IC's), resistors, integrated switches, processors, etc.

PWBs are potentially a difficult waste material to process since they generally have little usefulness once they are removed from the electrical system in which they were installed. In addition, they typically consist of materials that classify them as a hazardous or "special" waste stream. They must be segregated and handled separately from other nonhazardous solid waste streams. PWBs that are handled as waste materials must be processed using any one of several available disposal options. Not only are these options expensive, they require a significant amount of effort and handling by the generator. Furthermore, since some of these disposal options do not include destruction of the waste circuit boards, the generator also retains much of the liability associated with improper handling or disposal.

Different methods have been suggested to try to combat the waste of raw materials and environmental pollution caused by the ever increasing load of scrap electronic waste. To date, methods requiring a high energy demand are needed to separate the materials so that they can be recycled. Mechanical and hydrometallurgical methods have been the traditional methods of recycling of waste PWBs, which comprise grinding of the whole waste, followed by attempts to separate and concentrate different material streams. Disadvantageously, when PWBs are ground, only the plastic fraction can be effectively liberated from metals and toxic gases are evolved. Accordingly, mechanical methods do not result in high recovery rates, especially for precious metals. In hydrometallurgical methods, large amounts of chemicals are used, generating huge quantities of waste acids and sludge, which have to be disposed as hazardous waste. Furthermore, the overall processes of recycling of various metals by chemical processes are very long and complicated. Thermal methods, including pyrometallurgical processing of waste PWBs, result in the emission of hazardous chemicals to the atmosphere and water as the result of thermal degradation of epoxy (formation of dioxins and furans) and volatilization of metals (including Pb, Sb, As and Ga). Thermal methods are further characterized by high energy consumption, and the necessity to use expensive exhaust gas purification systems and corrosion resistance equipment.

Further, disadvantageously, the present methods of extracting precious metals (e.g., gold) from materials include using toxic and/or expensive chemicals (i.e., lixiviants) to leach the gold from the material. One of the oldest commercial processes for dissolving gold is the so-called "cyanide process" whereby the cyanide ion forms such a stable complex with gold. The effectiveness of the cyanide process has led to its commercial usage for both extraction of gold from its ores and for the reclamation of gold from gold coated scrap parts. Generally, a potassium cyanide solution is used in the "cyanide process." Disadvantageously, this solution is very toxic and disposing of spent cyanide solution has become a significant and increasing waste disposal and pollution abatement control problem. Gold has also been dissolved using a mixture of hydrochloric acid and nitric acid, known as "aqua regia," in order to obtain the complex chlorauric acid, $HAuCl_4$. Aqua regia, however, is extremely corrosive, yields toxic fumes, and does not have any selectivity for precious metals.

Printed wire boards without any components and solder (i.e., bare boards) represent a material that is much easier to recycle than populated circuit boards with mounted components, since bare boards by themselves consist only of copper and fiberglass foils glued by epoxy with some gold/nickel/copper plating on their surface. As bare board represents 65-70% by weight of an average populated printed circuit board, removal of components from the board leads to formation of an easily-recyclable material fraction, which represents 65-70% of the total volume. This approach is more advantageous compared to common practice of size reduction applied to the whole incoming material volume. Moreover, once removed from the boards, recovered components may be sorted and sold by type, such as components containing tantalum or components that can be reused, thereby generating multiple product streams with a higher retail value than just a mix of components.

Thus, a need exists for a method of recycling waste electrical and electronic equipment such as printed wire board components that overcomes or minimizes the above-referenced problems.

SUMMARY

The present invention relates generally to apparatuses and processes for recycling printed wire boards to separate materials for reuse and/or recovery. More particularly, the present invention relates generally to apparatuses and processes for recycling PWBs to efficiently recover precious metals, base metals, solder metals, and working integrated circuits while minimizing the amount of commodity chemicals and other resources used.

In one aspect, an apparatus for processing e-waste is described, said apparatus comprising:
(a) a mechanical solder removal module; and
(b) a chemical solder removal module;
wherein the modules are contiguously attached to one another.

In another aspect, a method of recycling e-waste is described, said method comprising:
removing at least a portion of the solder using a mechanical solder remover, wherein the mechanical solder remover comprises at least one blade and at least one agitator for the mechanical removal of solder from the surface;
removing at least a portion of the solder using a chemical solder remover, wherein the chemical solder remover comprises a container for a first composition and at least one agitator, wherein the PWB is partially immersed in the first composition; and
removing at least a portion of a precious metal using a leaching composition.

In still another aspect, an apparatus for processing e-waste is described, said apparatus comprising:
(a) a heating module for removing casing or epoxied components from a PWB; and
(b) a chemical solder removal module,
wherein the modules are contiguously attached to one another.

In yet another aspect, a method of recycling e-waste is described, said method comprising:
removing at least one casing from a PWB using a heating module, wherein the heating module comprises a heating mechanism and a means for moving the PWB through the heating mechanism;
removing at least a portion of the solder using a chemical solder remover, wherein the chemical solder remover comprises a container for a first composition and at least one agitator, wherein the PWB is partially immersed in the first composition; and
removing at least a portion of a precious metal using a leaching composition.

Other aspects, features and advantages will be more fully apparent from the ensuing disclosure and appended claims.

BRIEF DESCRIPTION OF THE DRAWINGS

FIG. 3 illustrates an embodiment of the apparatus for solder removal from a printed wire board.

FIG. 4 illustrates another embodiment of the apparatus for solder removal from a printed wire board.

FIG. 10 is a cell phone PWB before heating (A) and after heating (B)

FIG. 11 is the cell phone PWB of FIG. 10(A) before chemical desoldering (A) and after chemical desoldering.

DETAILED DESCRIPTION AND PREFERRED EMBODIMENTS THEREOF

Figure 1:
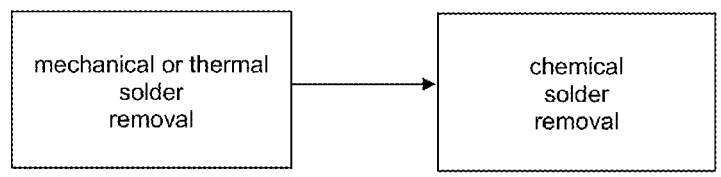
FIG. 1 illustrates the generalized apparatus and process for recycling printed wire boards.

The present invention relates generally to apparatuses and processes for recycling printed wire boards, integrated circuits and printed wire board components to separate materials for reuse and/or recovery. More particularly, the present invention relates generally to apparatuses and processes for recycling PWBs to more efficiently recover and separate metals and working components, while simultaneously minimizing the use of commodity chemicals and other resources.

As introduced in the background section, the traditional methods of recycling of waste PWBs result in environmental contamination, high cost expenditure and low efficiency. In contrast, the apparatuses and methods described herein are based on a differential approach to the recycling of materials, wherein the various parts of the waste PWBs are separated based on appearance and physical and chemical properties.

Processes for removing at least one recyclable material from a printed wire board (PWB) were previously described in International Patent Application No. PCT/US2011/032675 filed on Apr. 15, 2011 in the name of André Brosseau et al. and entitled "Method for Recycling of Obsolete Printed Circuit Boards," which is hereby incorporated herein in its entirety. Broadly, the method described in PCT/US2011/032675 comprised at least one of (a), (b), (c), or any combination thereof:
(a) releasing a component from the PWB;
(b) recovering a precious metal from the PWB and/or PWB component;
(c) recovering a base metal from the PWB.

For the purposes of the present disclosure, "electronic waste" or "e-waste" corresponds to computers, computer monitors, television receivers, electronic pads, cellular telephones, video cameras, digital cameras, DVD players, video game consoles, facsimile machines, copiers, MP3 players, and similar products that have reached the end of their useful life or otherwise have been disposed of Electronic waste or e-waste includes the components contained within these well known items such as printed wire boards and the components contained thereon (e.g., transistors, capacitors, heat sinks, IC's, resistors, integrated switches, chips and processors).

For the purposes of the general disclosure, the bare board is described as comprising paper, low dielectric plastics, thin and flexible plastics, ceramic/metal, fiberglass, epoxy and copper foil. As will be appreciated by the skilled artisan, "fiberglass" is a glass-reinforced plastic or a glass fiber reinforced plastic and will correspond to any material that comprises plastic and glass.

As used herein, "precious metals" include the metals gold, silver, platinum, palladium, rhodium, iridium, osmium, rhenium, ruthenium and alloys comprising same.

As used herein, "base metals" corresponds to iron, nickel, zinc, copper, aluminum, tungsten, molybdenum, tantalum, magnesium, cobalt, bismuth, cadmium, titanium, zirconium, antimony, manganese, beryllium, chromium, germanium, vanadium, gallium, hafnium, indium, niobium, rhenium, thallium, alloys comprising same, and combinations thereof.

As used herein, "copper" corresponds to Cu(0) metal as well as alloys comprising Cu(0).

"Substantially devoid" is defined herein as less than 2 wt. %, preferably less than 1 wt. %, more preferably less than 0.5 wt. %, and most preferably less than 0.1 wt. %. "Devoid" corresponds to 0 wt. %.

As used herein, "about" is intended to correspond to ±5% of the stated value.

As defined herein, "complexing agent" includes those compounds that are understood by one skilled in the art to be complexing agents, chelating agents, sequestering agents, and combinations thereof. Complexing agents will chemically combine with or physically associate with the metal atom and/or metal ion to be removed using the compositions described herein.

For the purposes of the present description, "printed wire boards" and "printed circuit boards" are synonymous and may be used interchangeably.

As used herein, the term "separation" corresponds to the complete removal of the component(s) from the PWB or the partial separation of the component(s) from the PWB, wherein the partial separation of the component from the PWB corresponds to the weakening of the solder holding the component(s) to the PWB and the remainder of the separation may be carried out by another method.

As used herein, "to remove" lead- or tin-containing solder relative to precious metals, base metals and/or tantalum-containing metals means that at least a portion of the lead- or tin-containing solder metal is mechanically removed or the lead- or tin-containing solder metal or ions are substantially dissolved or otherwise solubilized in a removal composition, preferably dissolved, while other metals are not mechanically removed, substantially dissolved or otherwise solubilized. "Substantially dissolved" is defined herein more than 95 wt. % of the material originally present is dissolved or otherwise solubilized, preferably more than 98 wt. %, more preferably more than 99 wt. %, and most preferably more than 99.9 wt. %. "Not substantially dissolved" is defined herein less than 5 wt. % of the material originally present is dissolved or otherwise solubilized, preferably less than 2 wt. %, more preferably less than 1 wt. %, and most preferably less than 0.1 wt. %.

As used herein, the term "leaches" corresponds to the complete removal or extraction of the gold or other precious metals from the PWB and/or PWB component into the leaching composition or the partial removal or extraction of the gold or other precious metals from the PWB and/or PWB component into the leaching composition. The gold or other precious metal is dissolved or otherwise solubilized in the leaching composition, preferably dissolved.

As defined herein, "crushing" the PWB and/or PWB components corresponds to any method that substantially exposes the gold and other precious metals of the PWB and/or PWB component to the leaching composition, e.g., cracking, pulverizing or shredding the PWB and/or PWB component. Preferably, the PWB components are cracked, thereby minimizing the amount of gold or other precious metals lost as a result of the pulverizing or shredding. Precious metals can be lost if scrap is pulverized wherein gold dust adheres to the separated stream and is lost in the magnetic fraction. Accordingly, crushing is further defined as a process whereby no more than 10% of the gold or other precious metals are lost to processes such as pulverizing or shredding, preferably no more than 5%, even more preferably no more than 2%. Moreover, crushing the e-waste minimizes the risk to human health by minimizing the release of dusts containing hazardous metals and brominated flame retardants.

It is well understood to the skilled artisan that "iodine" corresponds to the $I_2$ molecule while "iodide" ($I^-$) is an anion and is provided as a salt. Iodide salts include, but are not limited to, lithium iodide, sodium iodide, potassium iodide, ammonium iodide, calcium iodide, magnesium iodide, and tetraalkylammonium iodides, wherein the alkyl groups may be the same as or different from one another and are selected from the group consisting of straight-chained $C_1$-$C_6$ alkyls (e.g., methyl, ethyl, propyl, butyl, pentyl, hexyl) and branched $C_1$-$C_6$ alkyls.

As defined herein, "carbon" includes crystalline graphite, amorphous graphite, graphene, pyrolytic graphite, graphite oxide, graphite fibers, carbon nanotubes, conductive carbon, graphitized carbon, or any carbonaceous species that includes the alpha (hexagonally arranged carbon atoms) or beta (rhombohedrally arranged carbon atoms) form of graphite.

Compositions may be embodied in a wide variety of specific formulations, as hereinafter more fully described. In all such compositions, wherein specific constituents of the composition are discussed in reference to weight percentage ranges including a zero lower limit, it will be understood that such constituents may be present or absent in various specific embodiments of the composition, and that in instances where such constituents are present, they may be present at concentrations as low as 0.001 weight percent, based on the total weight of the composition in which such constituents are employed.

A First Apparatus and Method for Selectively Removing Solder from a PWB

Components are typically attached to the surface of PWBs with a lead, tin or lead-tin solder, which usually comes in combinations of 70Sn/30Pb, 60Sn/40Pb or 63Sn/37Pb. In certain applications Ag—Sn solder is used. Currently, the desoldering of PWBs for component removal involves heating the solder to melting temperature, whereby the liberated components separate from the PWB and the liquid solder is collected. This method applied for recycling PWBs has two main disadvantages: (i) as lead and tin are low-volatile metals, such heating and melting will create a high level of polluting emissions to the ambient air; and (ii) the heat will damage the components making them unacceptable for re-use.

The present inventors previously disclosed a method of separating a printed wire board component from a printed wire board in PCT/US2011/032675 using compositions. Broadly, said method comprised contacting a first composition with the printed wire board to selectively remove the printed wire board component from said printed wire board, wherein the printed wire board component is attached to the printed wire board using solder or some other affixing means. Although effective, the inventors sought to increase the efficiency of the first composition for removing the PWB components from the PWB.

Towards that end, in one aspect, an apparatus for removing solder from a surface is described, wherein the apparatus comprises mechanical solder removal means and chemical solder removal means (see, e.g., FIG. 1). Mechanical solder removal means include, but are not limited to, cutting blades, abrasive materials (e.g., bonded materials comprising aluminum oxide, silicon carbide, tungsten carbide, or garnet, or coated materials such as sandpaper), grinders, high pressure water or any other means whereby at least a portion of the solder can be removed from the surface. The mechanical solder removal means are preferably immersed in a liquid (e.g., water) and can further include an agitator such as brushes, rakes, or blown gases or liquids that are arranged parallel and/or perpendicular to the PWB to assist in the removal of the solder. Preferably, the mechanical solder removal means comprise cutting blades immersed in water that are capable of mechanically removing at least about 25% of the solder, more preferably at least about 35% of the solder and even more preferably at least about 45% of the solder. The number of cutting blades can be in a range from about 1 to about 500, depending on the apparatus setup and throughput. This aspect is especially useful for PWBs comprising components having lead-based solders.

Figure 2:
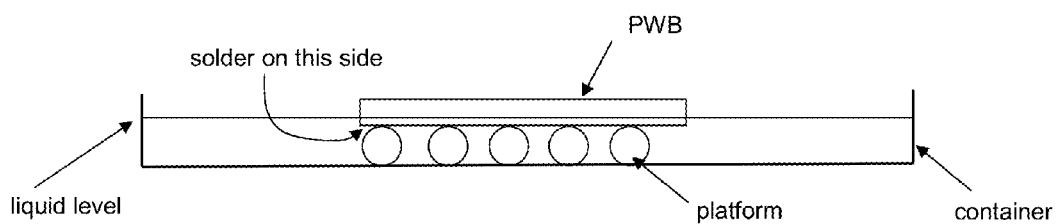
FIG. 2 illustrates the partial immersion of the recycling printed wire boards in the chemical solder remover composition.
Figure 5:
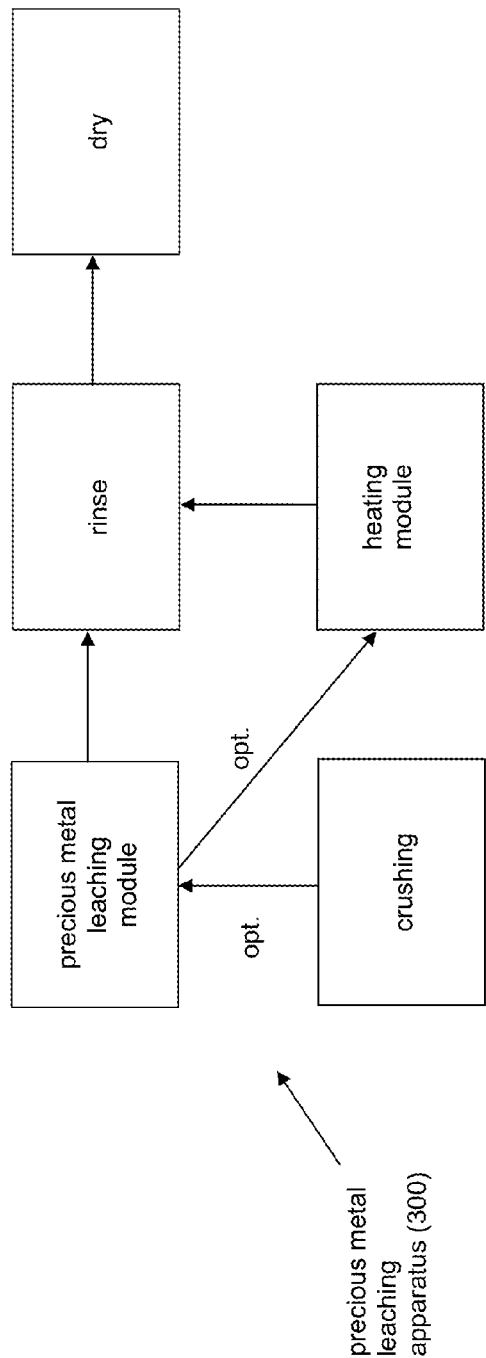
FIG. 5 illustrates an embodiment of the apparatus for gold leaching from printed wire boards and/or printed wire board components.

Chemical solder removal means include any apparatus that exposes the surface to a first composition to effectuate the chemical removal of solder therefrom. It should be appreciated that the exposure of the surface to the first composition can be effectuated in any suitable manner, e.g., by spraying the first composition on the surface, by dipping the surface in a volume of the first composition, by contacting the surface with another material, e.g., a pad, or fibrous sorbent applicator element, that has the first composition absorbed thereon, by contacting the surface with a recirculating composition, or by any other suitable means, manner or technique, by which the first composition is brought into contact with the material(s) to be removed. In a preferred embodiment, the surface is dipped in a volume of the first composition, wherein the volume can be substantial enough that the entire PWB comprising the surface is immersed or alternatively, the PWB is partially immersed such that only the surface comprising the solder is in the first composition (see, e.g., FIG. 2). Partial immersion is particularly favored when the PWB has solder on only one side of the board. In FIG. 2, the surface of the PWB comprising the solder is immersed, not the whole board. It should be appreciated that the level of liquid relative to the PWB thickness in FIG. 2 is just for visual demonstration and may vary as readily determined by the skilled artisan. Further, the "platform" illustrated in FIG. 2 is merely intended to elevate the PWB above the bottom of the container and is not limited to rollers (as shown), but can include a static flat surface (both solid or with pores or holes), a belt, a scaffold, protuberances (having curved, pointed or flat peaks), or any other means whereby the PWB can be raised above the bottom of the container. The chemical solder removal means can further include an agitator such as brushes, rakes, or blown gases or liquids that are arranged parallel and/or perpendicular to the PWB to assist in the removal of the solder.

In one embodiment of the first aspect, as shown in FIG. 3, an apparatus for removing solder from a surface of a printed wire board (PWB) comprises:
a mechanical solder remover;
a chemical solder remover;
a rinsing module; and
a drying module.
Preferably, the apparatus is designed such that the PWB moves automatically or manually from the mechanical solder remover to the chemical solder remover to the rinsing module and to the drying module. In a particularly preferred embodiment, the PWB moves on a conveyer belt, conveying rollers, or conveying wheels through the apparatus.

In another embodiment of the first aspect, as shown in FIG. 3, an apparatus for removing solder from a surface of a printed wire board (PWB) comprises:
a mechanical solder remover;
a chemical solder remover comprising a container for a first composition and at least one agitator, wherein the PWB is partially immersed in the first composition;
a rinsing module; and
a drying module.
Preferably, the apparatus is designed such that the PWB moves automatically from the mechanical solder remover to the chemical solder remover to the rinsing module and to the drying module. In a particularly preferred embodiment, the PWB moves on a conveyer belt, conveying rollers, or conveying wheels through the apparatus. Preferably, the agitator comprises at least one brush, rake, or blown gases or liquids.

In another embodiment of the first aspect, as shown in FIG. 3, an apparatus for removing solder from a surface of a printed wire board (PWB) comprises:
a mechanical solder remover, comprising at least one blade and at least one agitator for the mechanical removal of solder from the surface;
a chemical solder remover comprising a container for a first composition and at least one agitator;
a rinsing module; and
a drying module.
Preferably, the apparatus is designed such that the PWB moves automatically from the mechanical solder remover to the chemical solder remover to the rinsing module and to the drying module. In a particularly preferred embodiment, the PWB moves on a conveyer belt, conveying rollers, or conveying wheels through the apparatus. Preferably, the agitator comprises at least one brush, rake, or blown gases or liquids In still another embodiment of the first aspect, as shown in FIG. 3, an apparatus for removing solder from a surface of a printed wire board (PWB) comprises:
a mechanical solder remover, comprising at least one blade and at least one agitator for the mechanical removal of solder from the surface;
a chemical solder remover comprising a container for a first composition and at least one agitator, wherein the PWB is partially immersed in the first composition;
a rinsing module; and
a drying module.
Preferably, the apparatus is designed such that the PWB moves automatically from the mechanical solder remover to the chemical solder remover to the rinsing module and to the drying module. In a particularly preferred embodiment, the PWB moves on a conveyer belt, conveying rollers, or conveying wheels through the apparatus. Preferably, the agitator comprises at least one brush, rake, or blown gases or liquids Some integrated circuits (ICs) are affixed to PWBs using epoxy (e.g., North Bridge and South Bridge ICs and CPUs) and as such are not easily removed using the mechanical and chemical removal means described herein. Accordingly, in another embodiment, the apparatus for removing solder from a surface of a printed wire board (PWB) further comprises a heating module to soften the epoxy so that the ICs are easily removed to complete the removal of components and solder from the PWB.

Figure 7:
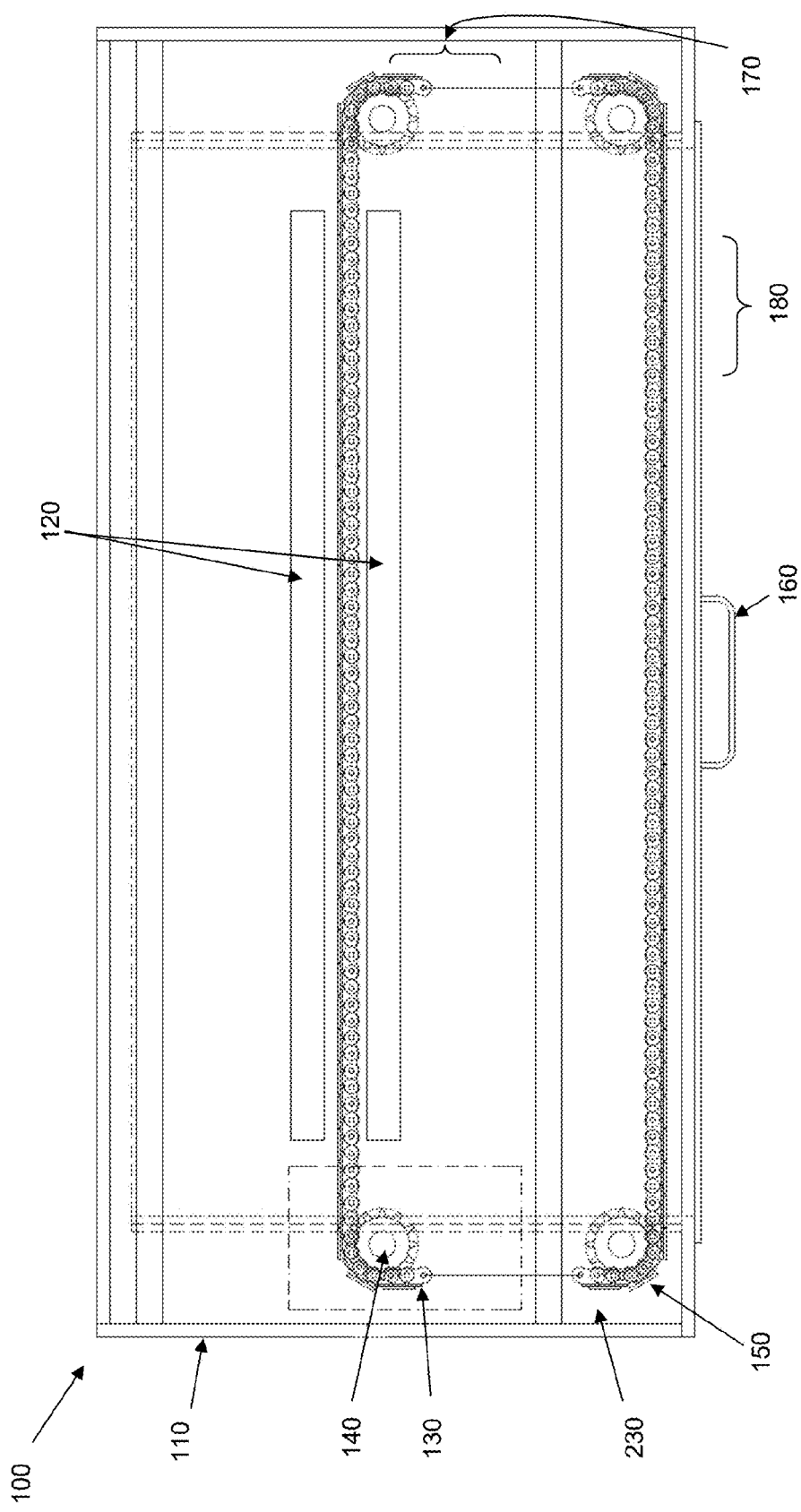
FIG. 7 is a top view in the internal components of a thermal desoldering unit.

Preferably, the heating modules 110 comprise a unit comprising means for moving the PWBs through a heating mechanism comprising agitation means for heating the epoxy and thereafter removing the epoxied ICs from the PWB. For example, FIG. 7 illustrates a top view of the heating module contemplated herein, wherein the means for moving the PWBs is a roller chain 130, although other means of moving the PWBs are contemplated including tracks, belts, and link chains. For example, the means for moving the PWBs can be a track with wheels that travel along the top of the track. The illustrated roller chain mechanism includes sprockets 140, wherein one sprocket can be shaft driven and can be operated at variable speeds, and the remaining sprockets can be free-wheels. The roller chain or other means for moving the PWBs assumes a circumference having an approximately rectangular shape, although alternative circumference shapes are contemplated.

Figure 8:
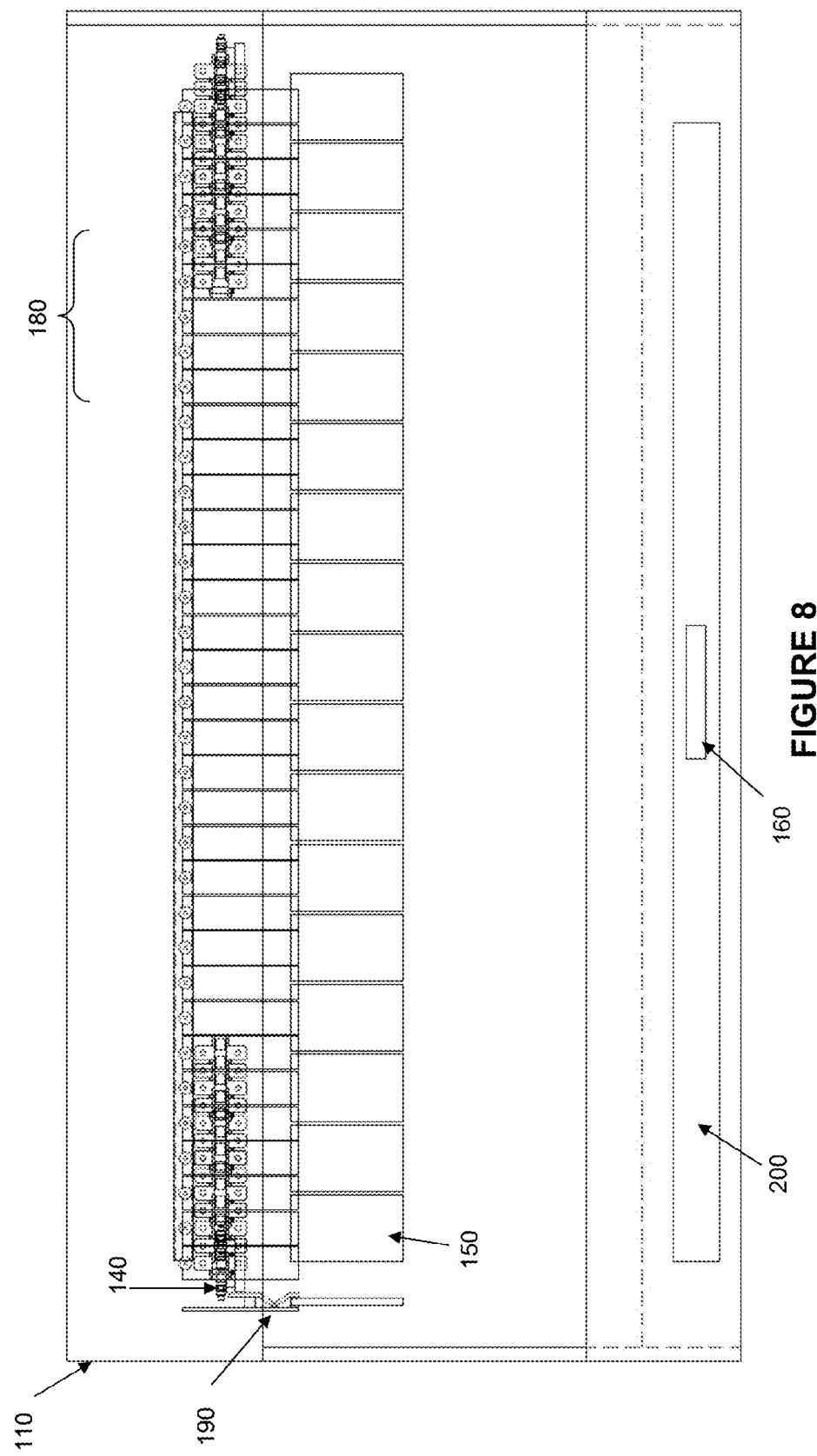
FIG. 8 is a front view of the internal components of the thermal desoldering unit of FIG. 7.

Attached to the roller chain or other means for moving the PWBs 150 are clips or clamps (see, 190 in FIGS. 8 and 9, which illustrate a front view and a side view, respectively, of the heating module contemplated herein) or other holding means, whereby the PWBs can be hung manually or automatically to the roller chain 130. Preferably, the PWBs are clipped in an attachment region 170 just prior to entry into the heating mechanism 120. The clips 190 are guided by a clip support clamp 210, which circumnavigates the roller chain or other means for moving PWBs. The PWBs are manually or automatically removed in disattachment region 180, wherein the PWBs are unclipped from the roller chain. For example, a solenoid can be positioned in the disattachment region 180 such that the clip 190 opens and the PWB falls into a trough 230 that collects the boards.

Regarding the heating mechanism 120, it is illustrated as two equally sized, parallel units that can be heated, for example, using resistance heating coils. Depending on the specific material to be removed, the heating mechanism 120 can be heated to the appropriate temperature, and the PWBs can be moved through. By maintaining the temperature less than the melting point of the epoxy, the epoxy can be softened without the simultaneous release of harmful or poisonous vapors. Thus for example, the heating mechanism 120 can be heated to temperatures that are preferably in a range from about 100 to about 400° C. Most preferably, the temperature is set at least 1° C. to about 20° C. below the melting point of the solder or epoxy to be removed. It should be appreciated that the region comprising the heating mechanism can be vented and the air scrubbed or filtered as readily understood by the person skilled in the art.

Figure 9:
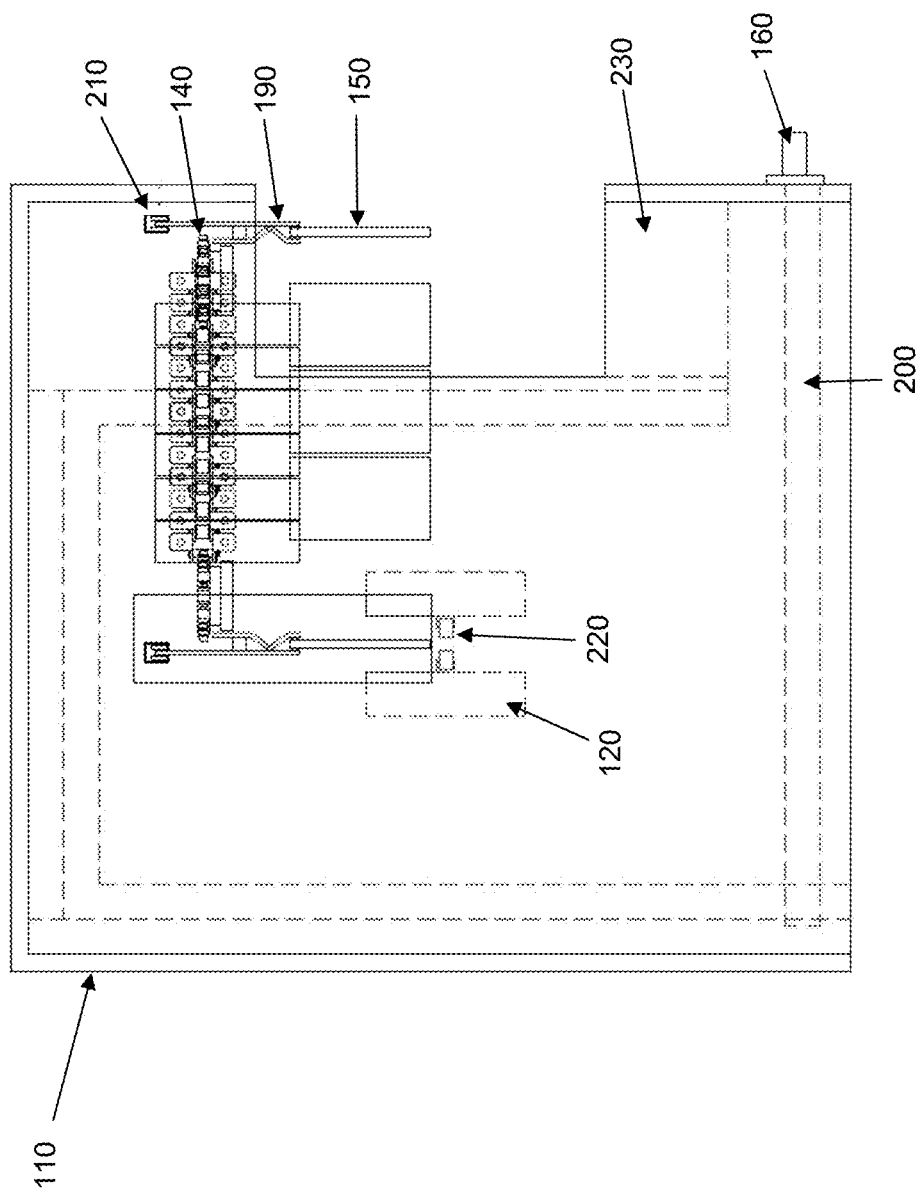
FIG. 9 is a side view of the internal components of the thermal desoldering unit of FIG. 7.

Referring to FIG. 9, brushes 220 are positioned within the heating mechanism such that following the softening of the epoxy, the epoxied IC can be easily brushed off the PWB chip. Other positions for brushes 220 are also envisioned, for example, outside the heating mechanism 120. Preferably, the brushes 220 have stainless steel bristles. Alternatives to brushes include, but are not limited to, high pressure gases or liquids, rakes, sonic energy and laser energy. In one particular embodiment, the heating mechanism 120 preferably includes means such that the heaters and brushes can be pushed in or retracted from the PWB. For example, the heaters and brushes can be pushed in or retracted mechanically, pneumatically, hydraulically or electromagnetically.

In practice, the PWBs 150 are attached to the roller chain in the attachment region and then enter the heating mechanism 120, whereby the temperature is less than the melting point of the epoxy. Simultaneously, the brushes 220 remove the epoxied ICs from the PWBs 150, and the ICs drop into a parts drawer 200. The PWBs minus ICs exit the heating mechanism 120 and are immediately cooled, for example at room temperature. As the PWBs travel along the roller chain, the disattachment region 180 is reached and the PWBs are unclipped and drop into the open trough 230. The ICs and/or PWBs are subsequently moved, manually or automatically (e.g., conveyed) to the chemical solder removal means.

Accordingly, the heating module apparatus for removing epoxied components from a PWB comprises: a heating mechanism and means for moving the PWBs through the heating mechanism, wherein the heating mechanism comprises agitation means for removing the components once the epoxy has been softened so that the component can be removed from the PWB. In one embodiment, the agitation means comprise brushes and the means for moving the PWBs through the heating mechanism comprises a roller chain. The PWB can be hung from the roller chain using clips or other clamping means. In a particular preferred embodiment, the heating mechanism is maintained at least 1° C. to about 20° C. below the melting point of the epoxy.

It is further contemplated that subsequent to the heating and removal of the epoxy-coated IC that the PWB can be re-introduced to the chemical solder remover, the rinsing module, and the drying module, as shown as an option in FIG. 3.

Accordingly, in another embodiment of the first aspect, as shown in FIG. 3, an apparatus for removing solder from a surface of a printed wire board (PWB) comprises:
a mechanical solder remover;
a chemical solder remover;
a heating module;
a rinsing module; and
a drying module.

Preferably, the apparatus is designed such that the PWB moves automatically or manually from the mechanical solder remover to the chemical solder removal to the rinsing module and to the drying module. The heating module can be positioned between the chemical solder remover and the rinsing module or alternatively, the heating module can be positioned after the drying module. It should be appreciated that if the heating module is positioned after the drying module, that the surface is preferably rinsed and dried again, either by directing the PWB into the same rinsing and drying modules (as shown schematically in FIG. 3) or alternatively, by directing the PWB to a second rinsing module and a second drying module. It is further contemplated that subsequent to the heating and removal of the epoxy-coated IC that the PWB can be re-introduced to the chemical solder remover, the rinsing module, and the drying module, as shown as an option in FIG. 3. In a particularly preferred embodiment, the PWB moves on a conveyer belt, conveying rollers, or conveying wheels through the apparatus. Preferably, the mechanical solder remover comprises at least one blade and at least one agitator for the mechanical removal of solder from the surface. Preferably, the chemical solder remover comprises a container for a first composition and at least one agitator, wherein the PWB is partially immersed in the first composition. Preferably, the agitator comprises at least one brush, rake, or blown gases or liquids.

In each case, the rinsing module comprises means of rinsing the PWB to remove the first composition therefrom. It should be appreciated that the rinsing of the surface can be effectuated in any suitable manner, e.g., by spraying a rinsing composition on the surface, by dipping the surface in a volume of the rinsing composition, by contacting the surface with another material, e.g., a pad, or fibrous sorbent applicator element, that has the rinsing composition absorbed thereon, by contacting the surface with a recirculating rinsing composition, or by any other suitable means, manner or technique, by which the rinsing composition is brought into contact with the material(s) to be removed. Preferably, the rinsing composition comprises water.

In each case, the drying module comprises means to dry the PWB. Preferred drying means include, but are not limited to, nitrogen gas, isopropanol, regenerative air, hot air or SEZ (spin process technology).

It should be appreciated that each embodiment of the apparatus can further comprise a component collector positioned subsequent to drying.

In a second aspect, the apparatus of the first aspect is used in a process of removing solder from the surface of a printed wire board (PWB), said process generally comprising removing at least a portion of the solder using mechanical solder removal means, and removing at least a portion of the solder using chemical solder removal means. This aspect is especially useful for PWBs comprising components having lead-based solders. Preferably, at least about 25% of the solder is removed using the mechanical solder removal means, more preferably at least about 35% of the solder and even more preferably at least about 45% of the solder. Preferably, at least about 90% of the solder is removed using the process, more preferably at least about 95% of the solder, and more preferably at least about 99% of the solder.

In one embodiment of the second aspect, a process of removing solder from the surface of the PWB comprises:
removing at least a portion of the solder using a mechanical solder remover, wherein the mechanical solder remover comprises at least one blade and at least one agitator for the mechanical removal of solder from the surface; and
removing at least a portion of the solder using a chemical solder remover.
The process can further comprise rinsing and drying of the PWB. Preferably, the agitator comprises at least one brush, rake, or blown gases or liquids.

In another embodiment of the second aspect, a process of removing solder from the surface of the PWB comprises:
removing at least a portion of the solder using a mechanical solder remover; and
removing at least a portion of the solder using a chemical solder remover, wherein the chemical solder remover comprises a container for a first composition and at least one agitator, wherein the PWB is partially immersed in the first composition.
The process can further comprise rinsing and drying of the PWB. Preferably, the agitator comprises at least one brush, rake, or blown gases or liquids.

In still another embodiment of the second aspect, a process of removing solder from the surface of the PWB comprises:
removing at least a portion of the solder using a mechanical solder remover, wherein the mechanical solder remover comprises at least one blade and at least one agitator for the mechanical removal of solder from the surface; and
removing at least a portion of the solder using a chemical solder remover, wherein the chemical solder remover comprises a container for a first composition and at least one agitator, wherein the PWB is partially immersed in the first composition.
The process can further comprise rinsing and drying of the PWB. Preferably, the agitator comprises at least one brush, rake, or blown gases or liquids.

The process of the second aspect can further comprises heating the surface of the PWB to remove epoxy-coated components. Accordingly, in yet another embodiment of the second aspect, a process of removing solder from the surface of the PWB comprises:
removing at least a portion of the solder using a mechanical solder remover;
removing at least a portion of the solder using a chemical solder remover; and
removing epoxy-covered components using heating means.
The process can further comprise rinsing and drying of the PWB. Preferably, the mechanical solder remover comprises at least one blade and at least one agitator for the mechanical removal of solder from the surface. Preferably, the chemical solder remover comprises a container for a first composition and at least one agitator, wherein the PWB is partially immersed in the first composition. Preferably, the agitator comprises at least one brush, rake, or blown gases or liquids.

Advantageously, the apparatus of the first aspect and the process of the second aspect provide a more environmentally-friendly way to remove components and solder from waste PWBs. The processes can be carried out at process temperatures less than about 35° C., thus eliminating emitted lead vapors and the need for venting and scrubbing of large amounts of air. Further, because the mechanical solder removal is preferentially carried out in a liquid (e.g., the blades are immersed in water), there is no dangerous lead-containing dust generated. Further, advantages associated with partial immersion of the PWB in the first composition include, but are not limited to, less wet chemicals are consumed, less wet chemicals need to be disposed of, and less rinsing composition is used. In addition, preferably the apparatus is fully automated and the PWBs are conveyed from module to module. The process for removing solder from the surface of the PWBs results in the separation of electronic components from the surface of PWBs, selectively removing the solder metals while the precious and base metals and the exposed epoxy of printed circuit laminate are unaffected. The apparatus and process provides a fast and economically efficient process for recycling/reworking waste PWBs, including reclamation of electronic components and forming a stream of more easily recyclable bare boards containing only copper, fiberglass reinforced epoxy and gold/nickel/copper plating.

The first composition is formulated to selectively remove the solder relative to precious metals, tantalum-containing metals, and/or base metals that are simultaneously present on said PWB. Preferably, the solder comprises lead, tin, or a combination of lead and tin. In use of the compositions described herein for removing lead and/or tin-containing materials from PWB's having same thereon, the first composition typically is contacted with the surface for a time of from about 5 sec to about 180 minutes, preferably about 1 min to 60 min, and most preferably about 5 minutes to about 45 minutes at temperature in a range of from about 20° C. to about 85° C., preferably in a range from about 20° C. to about 40° C. Such contacting times and temperatures are illustrative, and any other suitable time and temperature conditions may be employed that are efficacious to remove the solder to be removed from the PWB.

In one embodiment, the first composition comprises, consists of, or consists essentially of at least one oxidizing agent. The first composition may further comprise at least one lead and/or tin complexing agent, at least one organic solvent, and/or at least one passivating agent for passivating the precious metals, tantalum-containing metals, and/or base metals. Accordingly, in one embodiment, the first composition comprises, consists of, or consists essentially of at least one lead and/or tin complexing agent in combination with at least one oxidizing agent. In another embodiment, the first composition comprises, consists of, or consists essentially of at least one lead and/or tin complexing agent, at least one oxidizing agent, and at least one passivating agent for passivating the precious metals, tantalum-containing metals, and/or base metal materials. In still another embodiment, the first composition comprises, consists of, or consists essentially of at least one lead and/or tin complexing agent, at least one oxidizing agent, and at least organic solvent. In yet another embodiment, the first composition comprises, consists of, or consists essentially of at least one lead and/or tin complexing agent, at least one oxidizing agent, at least one organic solvent, and at least one passivating agent for passivating the precious metals, tantalum-containing metals, and/or base metal materials. In another embodiment, the first composition comprises, consists of, or consists essentially of at least one oxidizing agent and at least one organic solvent, wherein the first composition is substantially devoid of nitric acid, sulfuric acid, or combinations thereof. In still another embodiment, the first composition comprises, consists of, or consists essentially of at least one oxidizing agent and at least one passivating agent for passivating the precious metals, tantalum-containing metals, and/or base metals, wherein the first composition is substantially devoid of nitric acid, sulfuric acid, or combinations thereof. In yet another embodiment, the first composition comprises, consists of, or consists essentially of at least one oxidizing agent, at least one organic solvent, and at least one passivating agent for passivating the precious metals and/or copper materials, wherein the first composition is substantially devoid of nitric acid, sulfuric acid, or combinations thereof. In still another embodiment, the first composition comprises, consists of, or consists essentially of at least one oxidizing agent, at least one organic solvent, and at least one passivating agent for passivating the precious metals, tantalum-containing metals, and/or base metal materials, wherein the first composition is substantially devoid of sulfuric acid. These compositions possess the selectivity of lead and/or tin-containing materials relative to precious metals, tantalum-containing metals, and/or base metals thereby increasing the loading of the bath for the solder and increasing the bath-life of the first composition. Ion-exchange resins selective to lead and/or tin can be used in combination with the first composition to further extend the life of the bath. It should be appreciated that the first composition is an aqueous composition.

It should be appreciated by the skilled artisan that the first composition described herein represents just one version of the first composition of the process of the second aspect. Other compositions are contemplated for use in the process of the second aspect, as readily determined by one skilled in the art.

Oxidizing agents are included in the composition to oxidize the metals to be removed into an ionic form and accumulate highly soluble salts of dissolved metals. Oxidizing agents contemplated herein include, but are not limited to, ozone, nitric acid ($HNO_3$), bubbled air, cyclohexylaminosulfonic acid, hydrogen peroxide ($H_2O_2$), oxone (potassium peroxymonosulfate, $2KHSO_5.KHSO_4.K_2SO_4$), ammonium polyatomic salts (e.g., ammonium peroxomonosulfate, ammonium chlorite ($NH_4ClO_2$), ammonium chlorate ($NH_4ClO_3$), ammonium iodate ($NH_4IO_3$), ammonium perborate ($NH_4BO_3$), ammonium perchlorate ($NH_4ClO_4$), ammonium periodate ($NH_4IO_3$), ammonium persulfate (($NH_4)_2S_2O_8$), ammonium hypochlorite ($NH_4ClO$)), sodium polyatomic salts (e.g., sodium persulfate ($Na_2S_2O_8$), sodium hypochlorite (NaClO)), potassium polyatomic salts (e.g., potassium iodate ($KIO_3$), potassium permanganate ($KMnO_4$), potassium persulfate, potassium persulfate ($K_2S_2O_8$), potassium hypochlorite (KClO)), tetramethylammonium polyatomic salts (e.g., tetramethylammonium chlorite (($N(CH_3)_4)ClO_2$), tetramethylammonium chlorate ((N$(CH_3)_4)ClO_3$), tetramethylammonium iodate (($N(CH_3)_4)IO_3$), tetramethylammonium perborate (($N(CH_3)_4)BO_3$), tetramethylammonium perchlorate (($N(CH_3)_4)ClO_4$), tetramethylammonium periodate (($N(CH_3)_4)IO_4$), tetramethylammonium persulfate (($N(CH_3)_4)S_2O_8$)), tetrabutylammonium polyatomic salts (e.g., tetrabutylammonium peroxomonosulfate), peroxomonosulfuric acid, urea hydrogen peroxide (($CO(NH_2)_2)H_2O_2$), peracetic acid ($CH_3(CO)$OOH), sodium nitrate, potassium nitrate, ammonium nitrate, sulfuric acid, and combinations thereof. Although not oxidizing agents per se, for the sake of the present disclosure, oxidizing agents further include alkanesulfonic acids (e.g., methanesulfonic acid (MSA), ethanesulfonic acid, 2-hydroxyethanesulfonic acid, n-propanesulfonic acid, isopropanesulfonic acid, isobutenesulfonic acid, n-butanesulfonic acid, n-octanesulfonic acid), benzenesulfonic acid, benzenesulfonic acid derivatives (e.g., 4-methoxybenzenesulfonic acid, 4-hydroxybenzenesulfonic acid, 4-aminobenzenesulfonic acid, 4-nitrobenzenesulfonic acid, toluenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, tridecylbenzenesulfonic acid, tetradecylbenzene sulfonic acid, hexadecylbenzene sulfonic acid, 3-nitrobenzenesulfonic acid, 2-nitrobenzenesulfonic acid, 2-nitronaphthalenesulfonic acid, 3-nitronaphthalenesulfonic acid, 2,3-dinitrobenzenesulfonic acid, 2,4-dinitrobenzenesulfonic acid, 2,5-dinitrobenzenesulfonic acid, 2,6-dinitrobenzenesulfonic acid, 3,5-dinitrobenzenesulfonic acid, 2,4,6-trinitrobenzenesulfonic acid, 3-aminobenzenesulfonic acid, 2-aminobenzenesulfonic acid, 2-aminonaphthalenesulfonic acid, 3-aminonaphthalenesulfonic acid, 2,3-diaminobenzenesulfonic acid, 2,4-diaminobenzenesulfonic acid, 2,5-diaminobenzenesulfonic acid, 2,6-diaminobenzenesulfonic acid, 3,5-diaminobenzenesulfonic acid, 2,4,6-triaminobenzenesulfonic acid, 3-hydroxybenzenesulfonic acid, 2-hydroxybenzenesulfonic acid, 2-hydroxynaphthalenesulfonic acid, 3-hydroxynaphthalenesulfonic acid, 2,3-dihydroxybenzenesulfonic acid, 2,4-dihydroxybenzenesulfonic acid, 2,5-dihydroxybenzenesulfonic acid, 2,6-dihydroxybenzenesulfonic acid, 3,5-dihydroxybenzenesulfonic acid, 2,3,4-trihydroxybenzenesulfonic acid, 2,3,5-trihydroxybenzenesulfonic acid, 2,3,6-trihydroxybenzenesulfonic acid, 2,4,5-trihydroxybenzenesulfonic acid, 2,4,6-trihydroxybenzenesulfonic acid, 3,4,5-trihydroxybenzenesulfonic acid, 2,3,4,5-tetrahydroxybenzenesulfonic acid, 2,3,4,6-tetrahydroxybenzenesulfonic acid, 2,3,5,6-tetrahydroxybenzenesulfonic acid, 2,4,5,6-tetrahydroxybenzenesulfonic acid, 3-methoxybenzenesulfonic acid, 2-methoxybenzenesulfonic acid, 2,3-dimethoxybenzenesulfonic acid, 2,4-dimethoxybenzenesulfonic acid, 2,5-dimethoxybenzenesulfonic acid, 2,6-dimethoxybenzenesulfonic acid, 3,5-dimethoxybenzenesulfonic acid, 2,4,6-trimethoxybenzenesulfonic acid), and combinations thereof. The oxidizing agents can include a combination of the any of the species defined herein as oxidizing agent. The oxidizing agent may be introduced to the first composition at the manufacturer, prior to introduction of the first composition to the PWB, or alternatively at the PWB, i.e., in situ. Oxidizing agent is preferably present in the first composition an amount ranging from 0.1 to 90% by volume, more preferably from 10 to 60% by volume, and most preferably from 25 to 45% by volume. Preferably, the oxidizing agent comprises a peroxide compound, oxone, nitric acid and/or methanesulfonic acid. Most preferably, the oxidizing agent comprises methanesulfonic acid.

When present, it is thought that an effective amount of nitric acid serve as an accelerator of the solder removal process. Accordingly, in some embodiments, the oxidizing agent in the first composition preferably comprises an alkane sulfonic acid (e.g., MSA) and nitric acid, wherein the alkane sulfonic acid is present in an amount ranging from 0.1 to 90 vol %, more preferably from 10 to 60 vol %, and most preferably from 25 to 45 vol %, and the nitric acid is present in an amount of about 0.1 to 80 vol %, preferably from about 1 to 45 vol %, and most preferably from 5 to 15 vol %.

The complexing agents are included to complex the ions produced by the oxidizing agent. Complexing agents contemplated herein include, but are not limited to: β-diketonate compounds such as acetylacetonate, 1,1,1-trifluoro-2,4-pentanedione, and 1,1,1,5,5,5-hexafluoro-2,4-pentanedione; carboxylates such as formate and acetate and other long chain carboxylates; and amides (and amines), such as bis (trimethylsilylamide) tetramer. Additional chelating agents include amines and amino acids (i.e. glycine, serine, proline, leucine, alanine, asparagine, aspartic acid, glutamine, valine, and lysine), citric acid, acetic acid, maleic acid, oxalic acid, malonic acid, succinic acid, phosphonic acid, phosphonic acid derivatives such as hydroxyethylidene diphosphonic acid (HEDP), 1-hydroxyethane-1,1-diphosphonic acid, nitrilo-tris(methylenephosphonic acid), nitrilotriacetic acid, iminodiacetic acid, etidronic acid, ethylenediamine, ethylenediaminetetraacetic acid (EDTA), and (1,2-cyclohexylenedinitrilo)tetraacetic acid (CDTA), uric acid, tetraglyme, pentamethyldiethylenetriamine (PMDETA), 1,3,5-triazine-2,4,6-thithiol trisodium salt solution, 1,3,5-triazine-2,4,6-thithiol triammonium salt solution, sodium diethyldithiocarbamate, disubstituted dithiocarbamates ($R^1$ $(CH_2CH_2O)_2NR^2CS_2Na$) with one alkyl group ($R^2$=hexyl, octyl, deceyl or dodecyl) and one oligoether ($R^1(CH_2 CH_2O)_2$, where $R^1$=ethyl or butyl), ammonium sulfate, monoethanolamine (MEA), Dequest 2000, Dequest 2010, Dequest 2060s, diethylenetriamine pentaacetic acid, propylenediamine tetraacetic acid, 2-hydroxypyridine 1-oxide, ethylendiamine disuccinic acid (EDDS), N-(2-hydroxyethyl) iminodiacetic acid (HEIDA), sodium triphosphate penta basic, sodium and ammonium salts thereof, ammonium chloride, sodium chloride, lithium chloride, potassium chloride, ammonium sulfate, hydrochloric acid, sulfuric acid, and combinations thereof. Preferably, the complexing agent comprises HEDP, HEIDA, EDDS, sodium or ammonium salts thereof, sulfuric acid, or combinations thereof. The amount of oxidizing agent to complexing agent is in a volume percent ratio range from about 10:1 to about 1:10, preferably about 5:1 to about 1:5, and even more preferably about 2:1 to about 1:2, wherein the oxidizing agent constituent is dilute and present in a weight percent of about 1 wt % to about 50 wt %, e.g., a volume of 30 wt % hydrogen peroxide, and the complexing agent constituent is dilute and present in a weight percent of about 1 wt % to about 50 wt %, e.g., a volume of 1 wt % HEDP. For example, the first composition can comprise 1 part by volume of 30 wt % hydrogen peroxide plus 1 part by volume of a 1 wt % complexing agent.

Passivating agents for passivating the precious metals, tantalum-containing metals, and/or base metals include, but are not limited to, ascorbic acid, adenosine, L(+)-ascorbic acid, isoascorbic acid, ascorbic acid derivatives, citric acid, ethylenediamine, gallic acid, oxalic acid, tannic acid, ethylenediaminetetraacetic acid (EDTA), uric acid, 1,2,4-triazole (TAZ), triazole derivatives (e.g., benzotriazole (BTA), tolyltriazole, 5-phenyl-benzotriazole, 5-nitro-benzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole), 4-amino-1,2,4-triazole (ATAZ), 2-mercaptobenzimidazole (MBI), 2-mercaptobenzothiazole, 4-methyl-2-phenylimidazole, 2-mercaptothiazoline, 5-aminotetrazole (ATA), 5-amino-1,3,4-thiadiazole-2-thiol, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, mercaptobenzimidazole, 4-methyl-4H-1,2,4-triazole-3-thiol, 5-amino-1,3,4-thiadiazole-2-thiol, benzothiazole, tritolyl phosphate, imidazole, indiazole, benzoic acid, boric acid, malonic acid, ammonium benzoate, catechol, pyrogallol, resorcinol, hydroquinone, cyanuric acid, barbituric acid and derivatives such as 1,2-dimethylbarbituric acid, alpha-keto acids such as pyruvic acid, adenine, purine, phosphonic acid and derivatives thereof, glycine/ascorbic acid, Dequest 2000, Dequest 7000, p-tolylthiourea, succinic acid, phosphonobutane tricarboxylic acid (PBTCA), sodium molybdate, ammonium molybdate, salts of chromate (e.g., sodium, potassium, calcium, barium), sodium tungstate, salts of dichromate (e.g., sodium, potassium, ammonium), suberic acid, azaleic acid, sebacic acid, adipic acid, octamethylene dicarboxylic acid, pimelic acid, dodecane dicarboxylic acid, dimethyl malonic acid, 3,3-diethyl succinic acid, 2,2-dimethyl glutaric acid, 2-methyl adipic acid, trimethyl adipic acid, 1,3-cyclopentane dicarboxylic acid, 1,4-cyclohexane dicarboxylic acid, terephthalic acid, isophthalic acid, 2,6-naphthalene dicarboxylic acid, 2,7-naphthalene dicaroxylic acid, 1,4-naphthalene dicarboxylic acid, 1,4-phenylenedioxy diacetic acid, 1,3-phenylenedioxy diacetic acid, diphenic acid, 4,4'-biphenyl dicarboxylic acid, 4,4'-oxydibenzoic acid, diphenylmethane-4,4'-dicarboxylic acid, diphenylsulfone-4,4'-dicarboxylic acid, decamethylene dicarboxylic acid, undecamethylene dicarboxylic acid, dodecamethylene dicarboxylic acid, orthophthalic acid, naphthalenedicarboxylic acid, paraphenylenedicarboxylic acid, trimellitic acid, pyromellitic acid, sodium phosphates (e.g., sodium hexametaphosphate), sodium silicates, amino acids and their derivatives such as 1-arginine, nucleoside and nucleobases such as adensosine and adenine, respectively, and combinations thereof. Most preferably, the passivating agent comprises BTA, ATAZ, TAZ, triazole derivatives, ascorbic acid, sodium molybdate, or combinations thereof. In a particularly preferred embodiment, the passivating agent comprises sodium molybdate. More particularly, the role of the passivating agent is to reduce the composition's attack on copper. This prevents the thin gold plating on the copper from being undercut and lost as the copper dissolves, and it keeps such plating safe for a further gold extraction process. When present, the amount of passivating agent is in a range from about 0.01 to 5 wt %, preferably about 0.1 wt % to about 1 wt %, based on the total weight of the first composition.

Although not wishing to be bound by theory, it is thought that organic solvents enhance the metal etch rates by wetting the surface of the microelectronic device structure. Organic solvents contemplated herein include, but are not limited to, alcohols, ethers, pyrrolidinones, glycols, carboxylic acids, glycol ethers, amines, ketones, aldehydes, alkanes, alkenes, alkynes, carbonates, and amides, more preferably alcohols, ethers, pyrrolidinones, glycols, carboxylic acids, and glycol ethers such as methanol, ethanol, isopropanol, butanol, and higher alcohols (including diols, triols, etc.), tetrahydrofuran (THF), N-methylpyrrolidinone (NMP), cyclohexylpyrrolidinone, N-octylpyrrolidinone, N-phenylpyrrolidinone, methyl formate, dimethyl formamide (DMF), dimethylsulfoxide (DMSO), tetramethylene sulfone (sulfolane), diethyl ether, phenoxy-2-propanol (PPh), propriopheneone, ethyl lactate, ethyl acetate, ethyl benzoate, acetonitrile, acetone, ethylene glycol, propylene glycol, dioxane, butyryl lactone, butylene carbonate, ethylene carbonate, propylene carbonate, dipropylene glycol, amphiphilic species (diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether, dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, and combinations thereof), branched non-fluorinated ether-linkage carboxylic acids $(CH_3CH_2)_nO(CH_2)_mCOOH$, where n=1 to 10 and m=1 to 10), unbranched non-fluorinated ether-linkage carboxylic acids $(CH_3CH_2)_nO(CH_2)_mCOOH$, where n=1 to 10 and m=1 to 10), branched non-fluorinated non-ether linkage carboxylic acids $(CH_3(CH_2)_nCOOH$, where n=1 to 10), unbranched non-fluorinated non-ether linkage carboxylic acids $(CH_3(CH_2)_n COOH$, where n=1 to 10), dicarboxylic acids, tricarboxylic acids, and combinations thereof. Preferably, the organic solvent comprises diethylene glycol monobutyl ether, dipropylene glycol propyl ether, propylene glycol, or mixtures thereof. When present, the amount of organic solvent is in a range from about 0.01 wt % to about 25 wt %, preferably about 0.1 wt % to about 10 wt %, and most preferably about 0.1 wt % to about 5 wt %, based on the total weight of the first composition.

Typically hydrogen peroxide decomposes upon exposure to organics or metals, thus, compositions that contain hydrogen peroxide have a short shelf-life and thus must be mixed at the point of use. Due to the lack of infrastructure at some user sites, point of mix use is not an option because of a lack of proper plumbing and chemical delivery systems, which add cost to a manufacturing plant. Advantageously, when the first composition comprises the lead and/or tin complexing agent in combination with at least one oxidizing agent, the oxidizing agent is stabilized and thus can be pre-mixed, although it should be appreciated the said complexing agent and the at least one oxidizing agent may still be mixed at the point of use.

In another embodiment, the first composition comprises, consists of, or consists essentially of: at least one oxidizing agent; optionally at least one lead and/or tin complexing agent; optionally at least one organic solvent; optionally at least one passivating agent for passivating the precious metals, tantalum-containing metals, and/or base metals; and solder material. Preferably, the solder material comprises lead and/or tin-containing materials. The lead and/or tin-containing materials may be lead and/or tin ions dissolved and/or suspended in the composition described herein.

In still another embodiment, when the first composition includes nitric acid, the composition can further comprise ammonium sulfamate or sulfamic acid. The sulfamic ions are thought to stabilize the nitric acid and to suppress the evolution of toxic $NO_x$ fumes. When present, the amount of sulfamate ion is in a range from about 0.1 to 20 wt %, preferably of about 1 to 10 wt %, and most preferably of about 1 to 5 wt %, based on the total weight of the first composition.

In a particularly preferred embodiment, the first composition comprises, consists of, or consists essentially of MSA, at least one organic solvent, and at least one passivating agent, wherein the composition is substantially devoid of nitric acid, sulfuric acid, or combinations thereof. In another particularly preferred embodiment, the first composition comprises, consists of, or consists essentially of MSA, at least one glycol ether, and at least one passivating agent, wherein the composition is substantially devoid of nitric acid, sulfuric acid, or combinations thereof. In still another particularly preferred embodiment, the first composition comprises, consists of, or consists essentially of MSA, at least one glycol ether, and sodium molybdate, wherein the composition is substantially devoid of nitric acid, sulfuric acid, or combinations thereof. Even more preferably, the first composition comprises, consists of, or consists essentially of MSA, diethylene glycol monobutyl ether, sodium molybdate, and water, wherein the composition is substantially devoid of nitric acid, sulfuric acid, or combinations thereof. In still another embodiment, the first composition comprises, consists of, or consists essentially of MSA, at least one organic solvent, and at least one passivating agent, wherein the composition is substantially devoid of sulfuric acid. In yet another embodiment, the first composition comprises, consists of, or consists essentially of MSA, nitric acid, ammonium sulfamate, BTA, diethylene glycol monobutyl ether, and water, wherein the composition is substantially devoid of sulfuric acid. In another embodiment, the first composition comprises, consists of, or consists essentially of MSA, nitric acid, ammonium sulfamate, BTA and water, wherein the composition is substantially devoid of sulfuric acid. Additional embodiments of the first composition include (i) a first composition comprising, consisting of or consisting essentially of MSA, nitric acid, BTA and water; (ii) a first composition comprising, consisting of or consisting essentially of MSA, nitric acid, TAZ and water; (iii) a first composition comprising, consisting of or consisting essentially of MSA, nitric acid, 1-amino-1,2,4-triazole and water; (iv) a first composition comprising, consisting of or consisting essentially of MSA, nitric acid, 1-amino-1,2,3-triazole and water; (v) a first composition comprising, consisting of or consisting essentially of MSA, nitric acid, 1-amino-5-methyl-1,2,3-triazole and water; (vi) a first composition comprising, consisting of or consisting essentially of MSA, nitric acid, 3-amino-1,2,4-triazole and water; (vii) a first composition comprising, consisting of or consisting essentially of MSA, nitric acid, 3-mercapto-1,2,4-triazole and water; (viii) a first composition comprising, consisting of or consisting essentially of MSA, nitric acid, 3-isopropyl-1,2,4-triazole and water; (ix) a first composition comprising, consisting of or consisting essentially of MSA, nitric acid, MBI and water; (x) a first composition comprising, consisting of or consisting essentially of MSA, nitric acid, ATA and water; (xi) a first composition comprising, consisting of or consisting essentially of MSA, nitric acid, 2,4-diamino-6-methyl-1,3,5-triazine and water; (xii) a first composition comprising, consisting of or consisting essentially of MSA, nitric acid, ascorbic acid and water; (xiii) a first composition comprising, consisting of or consisting essentially of MSA, nitric acid, sodium molybdate and water; and (xiv) a first composition comprising, consisting of or consisting essentially of MSA, nitric acid, 3-amino-5-mercapto-1,2,4-triazole and water. Another first composition comprises, consists of, or consists essentially of sulfuric acid, oxone and propylene glycol.

It was found that the detachment and liberation of electronic components from the surface of PWBs can be achieved without addition of ferric nitrate if nitric acid is used in the first composition. In addition, the first composition can be substantially devoid of at least one of fluoride salts, other ferric salts, titanium (IV) salts, abrasive material, fluoroboric acid, and organic solvents including ethylene groups, e.g., ethylene, diethylene, triethylene, etc., and other HAP organic solvents. As used herein, "fluoride" species correspond to species including an ionic fluoride ($F^-$) or covalently bonded fluorine. It is to be appreciated that the fluoride species may be included as a fluoride species or generated in situ.

Advantageously, an easily recyclable chemical composition can be employed in a closed-loop process generating minimal waste. For example, when the first composition includes MSA, the MSA is easily recycled. For example, if the first composition includes MSA, a glycol ether and sodium molybdate, and said composition is contacted with Pb/Sn solder, the resulting composition including the Pb/Sn metals can be recycled by passing the composition through a carbon filter to remove the glycol ether and electrowinned to reclaim the Pb and Sn. The remaining solution including MSA can be reused. When no longer viable, the first composition can be rendered essentially non-toxic by electrowinning the Pb and Sn and neutralizing the excess acidity.

The first composition described can be used to selectively remove lead and/or tin-containing materials and are compatible with the PWB components, for example, transistors, capacitors, heat sinks, IC's, resistors, integrated switches, processors, etc., as well as the precious metals, tantalum-containing metals, and/or base metals exposed on said PWB. Furthermore, the first compositions are water soluble, non-corrosive, non-flammable and of low toxicity.

It should be appreciated that the first composition can be used at the point of use as formulated or following dilution with water. Preferably, the diluent is deionized water and the extent of dilution is about 1:1 to about 10:1 (water to first composition concentrate).

The first composition described herein has pH in a range from about 1 to about 12 and can be adjusted depending on the complexing agent used (when present). For example, when the complexing agent comprises HEDP, HEIDA or, salts thereof, the pH of the composition will be highly acidic, e.g., in a range from about 1 to about 4. When the complexing agent comprises EDDS, the pH of the composition may be advantageously dialed in by using different sodium salts of EDDS. For example, compositions comprising EDDS having three sodium ions will have a pH in a range from about 4 to about 8, preferably about 5 to about 7. Compositions comprising EDDS having four sodium ions will have a pH in a range from about 8 to about 12, preferably about 9 to about 11.

Preferred embodiments of the first compositions described herein include compositions comprising, consisting or, or consisting essentially of (i) EDDS/$H_2O_2$, (ii) HEIDA/$H_2O_2$, and (iii) MSA, nitric acid, ammonium sulfamate, BTA, diethylene glycol monobutyl ether and (iv) MSA, nitric acid, ATAZ.

The first compositions described herein are easily formulated by simple addition of the respective ingredients and mixing to homogeneous condition. Furthermore, the first composition may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

It should be appreciated by the skilled artisan that the solder attaches "components" such as transistors, capacitors, resistors, heat sinks, integrated circuits, integrated switches, processors, chips, etc. to the PWB. Advantageously, the first composition can be used to remove solder to separate the components from additional PWB surfaces until the first composition is saturated with lead and/or tin metals. With the removal of the solder, the components are released and said components may be separated using an optical system into those that are reusable and can be resold and those that can be further processed for disposal, reclamation of useful materials, etc. The composition used to remove the lead and/or tin solder may undergo electrowinning to reclaim pure lead and/or tin and/or alternatively can be processed using diffusion dialysis technology to concentrate the metal ions.

A Second Apparatus and Method for Selectively Removing Solder from a PWB

Some printed wire boards, for example those found in cell phones having WiFi capabilities, often comprise components that are covered by a casing, e.g., steel, affixed to the surface with solder, e.g., Ag—Sn. Mechanically removing the steel casing, e.g., cutting with blades is not a favored methodology. Accordingly, a method is needed to easily remove the steel casing and recycle the waste PWB.

Towards, that end, in a third aspect, an apparatus for removing solder from a surface is described, wherein the apparatus comprises a heating module and chemical solder removal means (see, e.g., FIG. 4). The apparatus of the third aspect is particularly useful for two-sided PWBs, odd-shaped PWBs, and/or PWBs comprising the aforementioned casing. It should be appreciated that the apparatus of the third aspect can be used to remove casings from one-sided PWBs as well. The heating module is used to soften the solder and adhesives, epoxies and glues so that the casing is easily removed from the PWB.

In one aspect, the heating modules 110 comprise a unit comprising means for moving the waste PWBs through a heating mechanism comprising agitation means for removing the casings from the PWB once the solder is softened. For example, FIG. 7 illustrates a top view of the heating module contemplated herein, wherein the means for moving the waste PWBs is a roller chain 130, although other means of moving the waste PWBs are contemplated including tracks, belts, and link chains. For example, the means for moving the waste PWBs can be a track with wheels that travel along the top of the track. The illustrated roller chain mechanism includes sprockets 140, wherein one sprocket can be shaft driven and can be operated at variable speeds, and the remaining sprockets can be free-wheels. The roller chain or other means for moving the waste PWBs assumes a circumference having an approximately rectangular shape, although alternative circumference shapes are contemplated.

Attached to the roller chain or other means for moving the waste PWBs 150 are clips or clamps (see, 190 in FIGS. 8 and 9, which illustrate a front view and a side view, respectively, of the heating module contemplated herein) or other holding means, whereby the waste PWBs can be hung manually or automatically to the roller chain 130. Preferably, the waste PWBs are clipped in an attachment region 170 just prior to entry into the heating mechanism 120. The clips 190 are guided by a clip support clamp 210, which circumnavigates the roller chain or other means for moving waste PWBs. The waste PWBs are manually or automatically removed in disattachment region 180, wherein the PWBs are unclipped from the roller chain. For example, a solenoid can be positioned in the disattachment region 180 such that the clip 190 opens and the waste PWB falls into a trough 230 that collects the boards.

Regarding the heating mechanism 120, it is illustrated as two equally sized, parallel units that can be heated using resistance heating coils. Depending on the specific material to be removed, the heating mechanism 120 can be heated to the appropriate temperature, and the waste PWBs can be moved through. By maintaining the temperature less than the melting point of the solder, the solder can be softened without the simultaneous release of harmful or poisonous vapors. Thus for example, the heating mechanism 120 can be heated to temperatures that are preferably in a range from about 100 to about 400° C. Most preferably, the temperature is set at least 1° C. to about 20° C. below the melting point of the solder to be softened. It should be appreciated that the region comprising the heating mechanism can be vented and the air scrubbed or filtered as readily understood by the person skilled in the art.

Referring to FIG. 9, brushes 220 are positioned within the heating mechanism such that following the softening of the solder, the casing can be easily brushed off the waste PWB chip. Preferably, the brushes 220 have stainless steel bristles. Alternatives to brushes include, but are not limited to, high pressure gases or liquids, rakes, sonic energy and laser energy. The heating mechanism 120 preferably includes means such that the heaters and brushes can be pushed in or retracted from the waste PWB. For example, the heaters and brushes can be pushed in or retracted mechanically, pneumatically, hydraulically or electromagnetically.

In practice, the waste PWBs 150 are attached to the roller chain in the attachment region and then enter the heating mechanism 120, whereby the temperature is less than the melting point of the solder. Simultaneously, the brushes 220 remove the casings from the waste PWBs 150, and the removed casings drop into a parts drawer 200. The waste PWBs minus the casings exit the heating mechanism 120 and are immediately cooled, for example at room temperature. As the waste PWBs travel along the roller chain, the disattachment region 180 is reached and the waste PWBs are unclipped and drop into the open trough 230. The casings and/or waste PWBs are subsequently moved, manually or automatically (e.g., conveyed) to the chemical solder removal means.

Accordingly, the heating module apparatus for removing casing from a waste PWB comprises: a heating mechanism and means for moving the waste PWBs through the heating mechanism, wherein the heating mechanism comprises agitation means for removing casing from the PWB once the solder has been softened solder. In one embodiment, the agitation means comprise brushes and the means for moving the waste PWBs through the heating mechanism comprises a roller chain. The waste PWB can be hung from the roller chain using clips or other clamping means. In a particular preferred embodiment, the heating mechanism is maintained at least 1° C. to about 20° C. below the melting point of the solder.

Advantageously, the heating module can be used to remove Pb—Sn solder, Ag—Sn solder and epoxy, as necessary.

Referring to FIG. 10(A), a waste PWB can be seen having the metal casings over the components and printed circuits. Subsequent to a 3-5 minute heat treatment at temperatures about 200° C., the casings are easily removed with brushes, to yield the waste PWB shown in FIG. 10(B).

Chemical solder removal means include any apparatus that exposes the surface to a first composition to effectuate the chemical removal of solder therefrom. It should be appreciated that the exposure of the surface to the first composition can be effectuated in any suitable manner, e.g., by spraying the first composition on the surface, by dipping the surface in a volume of the first composition, by contacting the surface with another material, e.g., a pad, or fibrous sorbent applicator element, that has the first composition absorbed thereon, by contacting the surface with a recirculating composition, or by any other suitable means, manner or technique, by which the first composition is brought into contact with the material(s) to be removed. In a preferred embodiment, the surface is dipped in a volume of the first composition, wherein the volume can be substantial enough that the waste PWB comprising the surface is immersed. Full immersion is especially preferred when the PWB is non-planar in structure. Large vessels comprising a perforated drum are also contemplated whereby large numbers of PWBs can be inserted in the vessels for chemical solder removal. Preferably, the vessels are agitated such that the first composition flows past the surfaces of the PWBs. In addition, the casings can be immersed in the first composition to remove residual solder. It should be appreciated that the casings can be immersed in the same or a different first composition that the PWBs are immersed in. Referring to FIG. 11, a waste PWB without the metal casing is shown before (FIG. 11(A)) and after (FIG. 11(B)) immersion in the first composition for 5-10 minutes at 40° C.

In one embodiment of the third aspect, as shown in FIG. 4, an apparatus for removing solder from a surface of a printed wire board (PWB) comprises:
a heating module;
a chemical solder remover;
a rinsing module; and
a drying module.
Preferably, the apparatus is designed such that the PWB moves automatically or manually from the heating module to the chemical solder remover to the rinsing module and to the drying module. In a particularly preferred embodiment, the PWB moves on a conveyer belt, conveying rollers, or conveying wheels through the apparatus.

In another embodiment of the third aspect, as shown in FIG. 4, an apparatus for removing solder from a surface of a printed wire board (PWB) comprises:
a heating module;
a chemical solder remover comprising a container for a first composition;
a rinsing module; and
a drying module.
Preferably, the apparatus is designed such that the PWB moves automatically or manually from the heating module to the chemical solder remover to the rinsing module and to the drying module. In a particularly preferred embodiment, the PWB moves on a conveyer belt, conveying rollers, or conveying wheels through the apparatus.

In another embodiment of the third aspect, as shown in FIG. 4, an apparatus for removing solder from a surface of a printed wire board (PWB) comprises:
a heating module, comprising a heating mechanism and means for moving the waste PWBs through the heating mechanism;
a chemical solder remover;
a rinsing module; and
a drying module.
Preferably, the apparatus is designed such that the PWB moves automatically or manually from the heating module to the chemical solder remover to the rinsing module and to the drying module. In a particularly preferred embodiment, the PWB moves on a conveyer belt, conveying rollers, or conveying wheels through the apparatus. Preferably, the heating module comprises agitation means comprising brushes and the means for moving the waste PWBs through the heating mechanism comprises a roller chain. The waste PWB can be hung from the roller chain using clips or other clamping means. In a particular preferred embodiment, the heating mechanism is maintained at least 1° C. to about 20° C. below the melting point of the solder or epoxy.

In still another embodiment of the third aspect, as shown in FIG. 4, an apparatus for removing solder from a surface of a printed wire board (PWB) comprises:
a heating module, comprising a heating mechanism and means for moving the waste PWBs through the heating mechanism;
a chemical solder remover comprising a container for a first composition;
a rinsing module; and
a drying module.
Preferably, the apparatus is designed such that the PWB moves automatically or manually from the heating module to the chemical solder remover to the rinsing module and to the drying module. In a particularly preferred embodiment, the PWB moves on a conveyer belt, conveying rollers, or conveying wheels through the apparatus. Preferably, the heating module comprises agitation means comprising brushes and the means for moving the waste PWBs through the heating mechanism comprises a roller chain. The waste PWB can be hung from the roller chain using clips or other clamping means. In a particular preferred embodiment, the heating mechanism is maintained at least 1° C. to about 20° C. below the melting point of the solder or epoxy.

In each case, the rinsing module comprises means of rinsing the PWB to remove the first composition therefrom. It should be appreciated that the rinsing of the surface can be effectuated in any suitable manner, e.g., by spraying a rinsing composition on the surface, by dipping the surface in a volume of the rinsing composition, by contacting the surface with another material, e.g., a pad, or fibrous sorbent applicator element, that has the rinsing composition absorbed thereon, by contacting the surface with a recirculating rinsing composition, or by any other suitable means, manner or technique, by which the rinsing composition is brought into contact with the material(s) to be removed. Preferably, the rinsing composition comprises water.

In each case, the drying module comprises means to dry the PWB. Preferred drying means include, but are not limited to, nitrogen gas, isopropanol, regenerative air, hot air or SEZ (spin process technology).

In a fourth aspect, the apparatus of the third aspect is used in a process of removing solder from the surface of a printed wire board (PWB), said process generally comprising removing casing or epoxied components from the surface of the PWB using heat, and removing at least a portion of the solder using chemical solder removal means. This aspect is especially useful for PWBs comprising casings that are affixed to the surface using the Ag—Sn-based solder, but it can be used when Pb—Sn solders or epoxies are used as well. Preferably, the casing or epoxied components are removed using agitation means comprising brushes. In a particular preferred embodiment, the heat is maintained at least 1° C. to about 20° C. below the melting point of the solder or epoxy. As previously described, the "casing" corresponds to a covering, often steel in material, that covers components on the PWB. The casing is typically affixed to the PWB using a Ag—Sn-based solder.

In one embodiment of the fourth aspect, a process of removing solder from the surface of the PWB comprises:
removing a casing from a surface of the PWB using heat; and
removing at least a portion of the solder using a chemical solder remover.
The process can further comprise rinsing and drying of the PWB. In a particular preferred embodiment, the heat is maintained at least 1° C. to about 20° C. below the melting point of the solder or epoxy In another embodiment of the fourth aspect, a process of removing solder from the surface of the PWB comprises:
removing a casing from a surface of the PWB using heat and at least one agitator; and
removing at least a portion of the solder using a chemical solder remover comprising a container for a first composition.
The process can further comprise rinsing and drying of the PWB. Preferably, the agitator comprises brushes. In a particular preferred embodiment, the heating mechanism is maintained at least 1° C. to about 20° C. below the melting point of the solder or epoxy.

In still another embodiment of the fourth aspect, a process of removing solder from the surface of the PWB comprises:
removing at least one casing and/or epoxied component from a PWB using a heating module, wherein the heating module comprises a heating mechanism and a means for moving the PWB through the heating mechanism;
removing at least a portion of the solder using a chemical solder remover, wherein the chemical solder remover comprises a container for a first composition and at least one agitator, wherein the PWB is partially immersed in the first composition; and
removing at least a portion of a precious metal using a leaching composition.

Advantageously, the apparatus of the third aspect and the process of the fourth aspect provide a more environmentally-friendly way to remove components and solder from waste PWBs.

Although the solder can comprise some silver, e.g., 3.5 wt % to 10 wt %, the first composition, as introduced hereinabove, selectively removes the solder relative to precious metals, tantalum-containing metals, and/or base metals that are simultaneously present on said PWB because the solder substantially comprises tin. In use of the compositions described herein for removing substantially tin-containing solder from PWB's having same thereon, the first composition typically is contacted with the surface for a time of from about 5 sec to about 180 minutes, preferably about 1 min to 60 min, and most preferably about 5 minutes to about 45 minutes at temperature in a range of from about 20° C. to about 85° C., preferably in a range from about 20°

C. to about 40° C. Such contacting times and temperatures are illustrative, and any other suitable time and temperature conditions may be employed that are efficacious to remove the solder to be removed from the PWB.

Apparatus and Method for Precious Metal Leaching from a PWB

In a fifth aspect, an apparatus for recycling a printed wire board (PWB) is described, said apparatus generally comprising precious metal leaching means.

The inventors previously introduced in International Patent Application PCT/US2011/032675 a composition and a method of recovering precious metals, e.g., gold, from precious metal-containing materials, wherein said method comprised introducing the precious metal-containing materials to a leaching composition comprising triiodide. Said precious metal-containing materials include, but are not limited to, electronic waste (e-waste) such as PWBs and/or PWB components. Preferably, the precious metal comprises gold. The precious metal containing materials could be added to the leaching composition as is, pulverized into a powder, shredded into pieces, crushed such that the hard shell (e.g., plastic) is cracked and the metals contained therein exposed, or in any other form so long as the metals contained in the precious metal containing materials are readily exposed for removal from the materials.

In use, the leaching compositions for leaching precious metals from precious metal containing materials were contacted with the precious metal containing materials for a time of from about 5 sec to about 180 minutes, preferably about 1 min to 60 min, and most preferably about 5 minutes to about 45 minutes at temperature in a range of from about 20° C. to about 60° C., preferably in a range from about 20° C. to about 40° C. Such contacting times and temperatures are illustrative, and any other suitable time and temperature conditions may be employed that are efficacious to remove precious metals from the precious metal containing materials. In application, the leaching composition is contacted in any suitable manner to the precious metal containing material, (e.g., PWB and/or PWB components), e.g., by spraying the composition on the PWB and/or PWB components, by dipping (in a volume of the composition) of the PWB and/or PWB components, by contacting the PWB and/or PWB components with another material, e.g., a pad, or fibrous sorbent applicator element, that has the composition absorbed thereon, or by any other suitable means, manner or technique, by which a leaching composition is brought into contact with the PWB and/or PWB components. Preferably, the PWB and/or PWB components are fully immersed in a volume of the leaching composition.

After the precious metal containing materials have been exposed to the leaching composition the leaching composition comprising the gold or other precious metals can be isolated from the PWBs and/or PWB components and precipitates that may be present. Isolation techniques include filtration, centrifugation, decanting, or a combination of any of these. The precious metal can be liberated from the leaching composition as described in PCT/US2011/032675. For example, solid metal can be obtained by reducing the gold or other precious metals in the leaching composition (e.g., with a reducing agent suitable for such purpose).

Although during the precious metal leaching process the dissolution of base metals is generally inhibited, some base metals can still accumulate in the composition after several repetitive leaching cycles. In order to remove these base metals, the leaching composition can be flowed through a packed column containing ion-exchange resins, where the dissolved base metals will be selectively captured, while the tri-iodide ions and the dissolved precious metals will pass through. The resins that can be used for this purpose are commercially available, strongly acidic cation exchangers (e.g., DOWEX ion exchange resins manufactured by The Dow Chemical Company). The purification of the leaching composition by base metal removal need not be a part of each leaching cycle, but can be repeated as often as the solution becomes polluted to the point that its effectiveness is negatively affected. The base metals can also be removed via electroplating either during the leaching process or after the leaching process and gold plating. This allows the leaching chemistry to be recycled more times since base metal loading is reduced before gold leaching commences again.

As soon as the leaching process is over and the loaded tri-iodide solution is separated from the leached material, the leached material can be rinsed (e.g., with water) to recover the leaching composition, which can contain very significant amounts of tri-iodide and dissolved gold. When the leached material comprises PWBs, a bare board comprising fiberglass, copper sheet and epoxy remains. The leaching composition may be readily removed from the PWB to which it has previously been applied using a rinse composition. Preferably, the rinse composition comprises water. Thereafter, the PWB may be dried using nitrogen or a spin-dry cycle.

Accordingly, in one embodiment, the fifth aspect comprises an apparatus for recycling a PWB and/or PWB component, said apparatus comprising precious metal removal means comprising:
a precious metal leaching module;
a rinsing module; and
a drying module.

Preferably, the apparatus is designed such that the PWB and/or PWB component moves automatically or manually from the precious metal leaching module to the rinsing module and to the drying module. In a particularly preferred embodiment, the PWB and/or PWB component moves on a conveyer belt, conveying rollers, or conveying wheels through the apparatus.

In another embodiment, an apparatus for recycling a PWB and/or PWB component is described, said apparatus comprising precious metal removal means comprising:
a precious metal leaching module comprising a container for a leaching composition comprising tri-iodide;
a rinsing module; and
a drying module.

Preferably, the apparatus is designed such that the PWB and/or PWB component moves automatically or manually from the precious metal leaching module to the rinsing module and to the drying module. In a particularly preferred embodiment, the PWB and/or PWB component moves on a conveyer belt, conveying rollers, or conveying wheels through the apparatus.

In another embodiment, an apparatus for recycling a PWB and/or PWB component is described, said apparatus comprising precious metal removal means comprising:
a crushing module;
a precious metal leaching module comprising a container for a leaching composition comprising tri-iodide;
a rinsing module; and
a drying module.

Preferably, the apparatus is designed such that the PWB and/or PWB component moves automatically or manually from the precious metal leaching module to the rinsing module and to the drying module. In a particularly preferred embodiment, the PWB and/or PWB component moves on a conveyer belt, conveying rollers, or conveying wheels through the apparatus.

In another embodiment, an apparatus for recycling a PWB and/or PWB component is described, said apparatus comprising precious metal removal means comprising:
a crushing module;
a precious metal leaching module comprising a container for a leaching composition comprising salt brine/acid mixtures or the first composition;
a rinsing module; and
a drying module.

Preferably, the apparatus is designed such that the PWB and/or PWB component moves automatically or manually from the precious metal leaching module to the rinsing module and to the drying module. In a particularly preferred embodiment, the PWB and/or PWB component moves on a conveyer belt, conveying rollers, or conveying wheels through the apparatus.

In each apparatus of the fifth aspect, the apparatus can optionally include a heating module, e.g., analogous to that of the first aspect, wherein the PWB is directed to a heating module to soften epoxy in the event any additional epoxy-coated components remain on the board so that said components are easily removed. Heating modules can be easily incorporated into the apparatus subsequent to the precious metal leaching module and preferably comprise vented ovens wherein temperatures in a range from about 100 to 400° C. can be achieved to soften the ICs that are affixed to the PWB using epoxy. Agitators such as brushes, rakes, or blown gases or liquids positioned within the heating module readily effectuate the removal of the components once the epoxy is softened. The vented ovens preferably include scrubbing means since lead vapors are likely a byproduct of the heating process.

The crushing module, when used, can be inline or crushing can be effectuated separately and the crushed PWB and/or PWB components automatically or manually fed into the apparatus. Crushing means include, but are not limited to, means for pulverizing, means for shredding, and means for crushing the PWB and/or PWB components so that the hard shell (e.g., plastic) is cracked, as readily determined by the person skilled in the art. Preferably, when PWBs are being processed they are crushed to crack the board. Preferably, when PWB components are being processed they are pulverized into a powder.

In each case, the rinsing module comprises means of rinsing the PWB and/or PWB components to remove the leaching composition therefrom. It should be appreciated that the rinsing of the surface can be effectuated in any suitable manner, e.g., by spraying a rinsing composition on the surface, by dipping the surface in a volume of the rinsing composition, by contacting the surface with another material, e.g., a pad, or fibrous sorbent applicator element, that has the rinsing composition absorbed thereon, by contacting the surface with a recirculating rinsing composition, or by any other suitable means, manner or technique, by which the rinsing composition is brought into contact with the material(s) to be removed. Preferably, the rinsing composition comprises water.

In each case, the drying module comprises means to dry the PWB. Preferred drying means include, but are not limited to, nitrogen gas, isopropanol, regenerative air, hot air or SEZ (spin process technology).

The tri-iodide ion can be introduced in the leaching composition by any known method including, but not limited to: dissolution of iodine in an aqueous solutions of iodides (e.g., KI, NaI, $NH_4I$) or hydroiodic acid; in situ generation of iodine which reacts with excess iodide to form triiodide; oxidation of aqueous solutions of iodides by nitric acid, ozone, hypochlorite and the like; and reaction of an iodide with an iodate in acidic media. Several are described at length below.

Iodine ($I_2$) is very expensive and has low solubility in water but it can be generated in situ. Iodine in an aqueous solution of iodide is present as the triiodide ioin. The process utilizes iodine to oxidize the gold while iodide contributes to solubilizing the oxidized gold by formation of a gold iodide complex.

In one embodiment, the leaching composition comprises, consists of, or consists essentially of at least one oxidizing agent, at least one iodide salt or hydroiodic acid and water. In another embodiment, the leaching composition comprises, consists of, or consists essentially of at least one oxidizing agent, at least one iodide salt or hydroiodic acid, water, optionally at least one organic solvent, optionally at least one metal passivating agent, optionally at least one surfactant, optionally at least one buffering agent. In another embodiment, the leaching composition comprises, consists of, or consists essentially of at least one oxidizing agent, at least one iodide salt or hydroiodic acid, water, and at least one organic solvent. In still another embodiment, the leaching composition comprises, consists of, or consists essentially of at least one oxidizing agent, at least one iodide salt or hydroiodic acid, water, and at least one metal passivating agent. In still another embodiment, the leaching composition comprises, consists of, or consists essentially of at least one oxidizing agent, at least one iodide salt or hydroiodic acid, water, at least one metal passivating agent, and at least one buffering agent. In still another embodiment, the leaching composition comprises, consists of, or consists essentially of at least one oxidizing agent, at least one iodide salt or hydroiodic acid, water, and at least one surfactant. In yet another embodiment, the leaching composition comprises, consists of, or consists essentially of at least one oxidizing agent, at least one iodide salt or hydroiodic acid, water, at least one organic solvent, and at least one metal passivating agent. In yet another embodiment, the leaching composition comprises, consists of, or consists essentially of at least one oxidizing agent, at least one iodide salt or hydroiodic acid, water, at least one organic solvent, and at least one surfactant. In yet another embodiment, the leaching composition comprises, consists of, or consists essentially of at least one oxidizing agent, at least one iodide salt or hydroiodic acid, water, at least one surfactant, and at least one metal passivating agent. In yet another embodiment, the leaching composition comprises, consists of, or consists essentially of at least one oxidizing agent, at least one iodide salt or hydroiodic acid, water, at least one organic solvent, at least one surfactant, and at least one metal passivating agent. It is understood that the iodide salt or hydroiodic acid and the oxidizing agent present in the leaching composition will react to form iodine in situ and iodide ion will be in excess, resulting in the formation of triiodide. Accordingly, the leaching composition subsequent to the in situ reaction will comprise, consist of, or consist essentially of triiodide and water. In another embodiment, the leaching composition subsequent to the in situ reaction will comprise, consist of, or consist essentially of triiodide, water, and at least one organic solvent. In still another embodiment, the leaching composition subsequent to the in situ reaction will comprise, consist of, or consist essentially of triiodide, water, and at least one passivating agent. In still another embodiment, the leaching composition subsequent to the in situ reaction will comprise, consist of, or consist essentially of triiodide, water, and at least one surfactant. In yet another embodiment, the leaching composition subsequent to the in situ reaction will comprise, consist of, or consist essentially of triiodide, water, at least one organic solvent, and at least one passivating agent. In yet another embodiment, the leaching composition subsequent to the in situ reaction will comprise, consist of, or consist essentially of triiodide, water, at least one organic solvent, and at least one surfactant. In yet another embodiment, the leaching composition subsequent to the in situ reaction will comprise, consist of, or consist essentially of triiodide, water, at least one surfactant, and at least one passivating agent. In yet another embodiment, the leaching composition subsequent to the in situ reaction will comprise, consist of, or consist essentially of triiodide, water, at least one organic solvent, at least one surfactant, and at least one passivating agent. The leaching composition is formulated to selectively and substantially leach gold from the e-waste into a fraction that can be further processed to reclaim said gold. For example, in one embodiment, the leaching composition can be used to separate gold or other precious from base metals, wherein the base metals remain as a solid.

Potential oxidizing agents were previously defined herein for use in the first composition. Preferably, the oxidizing agent in the leaching composition comprises oxone, sodium persulfate, ammonium persulfate, potassium persulfate, nitric acid, hydrogen peroxide, ferric chloride, ferric nitrate, or combinations thereof. Even more preferably, the oxidizing agent in the leaching composition comprises ammonium persulfate, sodium persulfate, nitric acid, periodic acid, oxone, sodium hypochlorite, or combinations thereof. The amount of oxidizing agent in the leaching composition is in a range from about 0.01 wt % to about 25 wt %, preferably about 1 wt % to about 20 wt %, and most preferably about 1 wt % to about 10 wt %.

Iodide salts include, but are not limited to, lithium iodide, sodium iodide, potassium iodide, ammonium iodide, calcium iodide, magnesium iodide, and tetraalkylammonium iodides, wherein the alkyl groups may be the same as or different from one another and are selected from the group consisting of straight-chained $C_1$-$C_6$ alkyls (e.g., methyl, ethyl, propyl, butyl, pentyl, hexyl) and branched $C_1$-$C_6$ alkyls. Preferably, the iodide salt comprises potassium iodide. Hydroiodic acid can be used instead of an iodide salt. The amount of iodide salt is in a range from about 0.1 wt % to about 50 wt %, preferably about 1 wt % to about 40 wt %, and most preferably about 10 wt % to about 35 wt %.

Potential organic solvents were previously defined herein for use in the first composition. Most preferably, when present, the organic solvent in the leaching composition comprises an alcohol, diethylene glycol monobutyl ether, propylene glycol, dipropylene glycol n-butyl ether, carbonates such as ethylene carbonate, and combinations thereof. When included, the amount of organic solvent in the leaching composition is in a range from about 0.01 wt % to about 20 wt %, preferably about 1 wt % to about 10 wt %, and most preferably about 1 wt % to about 5 wt %.

Potential passivating agents were previously defined herein for use in the first composition. When included, the amount of passivating agent in the leaching composition is in a range from about 0.01 wt % to about 10 wt %, preferably about 0.05 wt % to about 5 wt %, and most preferably about 0.05 wt % to about 2 wt %.

Surfactants contemplated include, but are not limited to, acids and bases, non-ionic surfactants, anionic surfactants, cationic surfactants, zwitterionic surfactants, and combinations thereof. Preferred acidic or basic surfactants include, but are not limited to, surfactants having an acid or base functionality ("head") and a straight-chained or branched hydrocarbon group ("tail") and/or surfactants having an acid functionality ("head") and a perfluorinated hydrocarbon group ("tail"). Preferred acid or base functionalities include phosphoric, phosphonic, phosphonic monoesters, phosphate monoesters and diesters, carboxylic acids, dicarboxylic acid monoesters, tricarboxylic acid mono- and diesters, sulfate monoesters, sulfonic acids, amines, and salts thereof. The hydrocarbon groups preferably have at least 10, e.g., 10-20, carbon atoms (e.g., decyl, undecyl, dodecyl, tridecyl, tetradecyl, pentadecyl, hexadecyl, heptadecyl, octadecyl, nonadecyl, eicosyl), except that somewhat shorter hydrocarbon groups of 6-16 carbons (e.g. hexyl, 2-ethylhexyl, dodecyl) are preferred where the molecule contains two alkyl chains such as in phosphate diesters and phosphonate monoesters. The perfluorinated hydrocarbon groups preferably have 7-14 carbon atoms (e.g., heptyl, octyl, nonyl, decyl, undecyl, dodecyl, tridecyl, tetradecyl). Preferred surfactants include decylphosphonic acid, dodecylphosphonic acid, tetradecylphosphonic acid, hexadecylphosphonic acid, bis(2-ethylhexyl)phosphate, octadecylphosphonic acid, perfluoroheptanoic acid, perfluorodecanoic acid, trifluoromethanesulfonic acid, phosphonoacetic acid, dodecylbenzenesulfonic acid, and dodecylamine.

Non-ionic surfactants contemplated include, but are not limited to, polyoxyethylene lauryl ether (Emalmin NL-100 (Sanyo), Brij 30, Brij 98), dodecenylsuccinic acid monodiethanol amide (DSDA, Sanyo), ethylenediamine tetrakis (ethoxylate-block-propoxylate) tetrol (Tetronic 90R4), polyoxyethylene polyoxypropylene glycol (Newpole PE-68 (Sanyo), Pluronic L31, Pluronic 31R1), polyoxypropylene sucrose ether (SN008S, Sanyo), t-octylphenoxypolyethoxyethanol (Triton X100), Polyoxyethylene (9) nonylphenylether, branched (IGEPAL CO-250), polyoxyethylene sorbitol hexaoleate, polyoxyethylene sorbitol tetraoleate, polyethylene glycol sorbitan monooleate (Tween 80), sorbitan monooleate (Span 80), alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives such as SIS6952.0 (Siliclad, Gelest), siloxane modified polysilazane such as PP1-SG10 Siliclad Glide 10 (Gelest), silicone-polyether copolymers such as Silwet L-77 (Setre Chemical Company), Silwet ECO Spreader (Momentive), and alcohol ethoxylates (Natsurf™ 265, Croda).

Cationic surfactants contemplated include, but are not limited to, heptadecanefluorooctane sulfonic acid tetraethylammonium, stearyl trimethylammonium chloride (Econol TMS-28, Sanyo), 4-(4-diethylaminophenylazo)-1-(4-nitrobenzyl)pyridium bromide, cetylpyridinium chloride monohydrate, benzalkonium chloride, benzethonium chloride benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis (decyl)ammonium bromide, Aliquat® 336 and oxyphenonium bromide. The hydrocarbon groups preferably have at least 10, e.g., 10-20, carbon atoms (e.g., decyl, undecyl, dodecyl, tridecyl, tetradecyl, pentadecyl, hexadecyl, heptadecyl, octadecyl, nonadecyl, eicosyl), except that somewhat shorter hydrocarbon groups of 6-20 carbons (e.g. hexyl, 2-ethylhexyl, dodecyl) are preferred where the molecule contains two functionized alkyl chains such as in dimethyldioctadecylammonium chloride, dimethyldihexadecylammonium bromide and di(hydrogenated tallow)dimethylammonium chloride.

Anionic surfactants contemplated include, but are not limited to, sodium polyoxyethylene lauryl ether, sodium dihexylsulfosuccinate, dicyclohexyl sulfosuccinate sodium salt, sodium 7-ethyl-2-methyl-4-undecyl sulfate (Tergitol 4), SODOSIL RM02, and phosphate fluorosurfactants such as Zonyl FSJ.

Zwitterionic surfactants include, but are not limited to, ethylene oxide alkylamines (AOA-8, Sanyo), N,N-dimethyldodecylamine N-oxie, sodium cocaminpropinate (LebonApl-D, Sanyo), 3-(N,N-dimethylmyristylammonio)propanesulfonate, and (3-(4-heptyl)phenyl-3-hydroxypropyl)dimethylammoniopropanesulfonate.

Inorganic acids may be optionally added to of the leaching compositions. For example, the leaching composition may further include sulfuric, hydrochloric, hydrobromic, or hydroiodic acid.

The pH of the leaching composition is preferably about 3 to about 10, more preferably about 4 to about 8 and most preferably about 6 to about 8. In a preferred embodiment, a buffering agent is added to maintain the pH of the leaching composition in the range from about 5 to about 8. Buffering agents are well known in the art and can include, for example, phosphate buffer such as monosodium phosphate/disodium phosphate or monopotassium phosphate/dipotassium phosphate.

The leaching compositions are easily formulated by simple addition of the respective ingredients and mixing to homogeneous condition. Furthermore, the compositions may be readily formulated as multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions can variously and alternatively comprise, consist or consist essentially of any combination of ingredients consistent with the disclosure herein.

Preferably, in one embodiment, the leaching composition comprises, consists of, or consists essentially of potassium iodide, sodium persulfate and water, more preferably about 20 wt % to about 30 wt % potassium iodide, about 4 wt % to about 10 wt % sodium persulfate and water. In another embodiment, the leaching composition comprises, consists of, or consists essentially of potassium iodide, ammonium persulfate and water, more preferably about 20 wt % to about 30 wt % potassium iodide, about 4 wt % to about 10 wt % ammonium persulfate and water. In yet another embodiment, the leaching composition comprises, consists of, or consists essentially of potassium iodide, sodium persulfate, BTA, and water. In yet another embodiment, the leaching composition comprises, consists of, or consists essentially of potassium iodide, sodium persulfate, BTA, phosphate buffer, and water. In still another embodiment, the leaching composition comprises, consists of, or consists essentially of potassium iodide, nitric acid and water. In another embodiment, the leaching composition comprises, consists of, or consists essentially of potassium iodide, periodic acid, hydrochloric acid and water. The leaching composition in another embodiment comprises, consists of, or consists essentially of potassium iodide, oxone and water. In still another embodiment, the leaching composition comprises, consists of, or consists essentially of potassium iodide, sodium hypochlorite, hydrochloric acid and water. In yet another embodiment, the leaching composition comprises, consists of, or consists essentially of potassium iodide, in situ generated iodine and water. The leaching compositions are substantially devoid of aqua regia and cyanide-containing components. Preferably, the leaching compositions are water soluble, non-corrosive, non-flammable and of low toxicity.

It should be appreciated by the skilled artisan that once the gold or other precious metals are leached from the PWBs and/or PWB components, the remaining material(s) may be disposed of, recycled or undergo further reclamation. Following the extraction/leaching of the gold or other precious metals into the leaching composition, the gold or other precious metals can be obtained by reducing the metal ions, as discussed at length in PCT/US2011/032675. Preferably, the reducing agent is a so-called environmentally friendly chemical. Preferred reducing agents include, but are not limited to, ascorbic acid, diethyl malonate, sodium metabisulfite, polyphenon 60 (P60, green tea extract), glucose, and sodium citrate. For example, as introduced in U.S. Provisional Patent Application No. 61/375,273 filed on Aug. 20, 2010 and entitled "Sustainable Process for Reclaiming Precious Metals and Base Metals from e-Waste," which is hereby incorporated by reference herein in its entirety, ascorbic acid introduced to a composition comprising $Au^{3+}$ ions at pH 1 produces highly pure gold metal. Sodium metabisulfite (SMB) can be added to a composition comprising $Au^{3+}$ ions at pH 1 or pH 7 and produce highly pure gold metal. Alternatively, the gold ions can be converted to gold metal via electrowinning or electrochemical techniques. Any suitable means can be used to remove the precipitated gold. Settling and decanting, filtering the solution through a filter press or centrifuging are convenient procedures for such removal.

It is also contemplated that the leaching composition can be used to simultaneously separate carbon and precious metals from the PWB solid materials. Specifically, the precious metal leaching module can further comprise means for froth flotation, wherein the froth flotation is used to separate the carbon from the other materials. Froth flotation employs a frothing agent, which generates a stable foamy layer (the "froth") on top of an aqueous column, and a collecting agent which serves to concentrate the carbon in the froth layer. In general, the method of separating carbon from the e-waste comprises contacting the e-waste comprising said carbon and precious metals with the leaching composition, said leaching composition comprising triiodide as described herein and at least one frothing agent and at least one collecting agent to form a mixture; generating a froth layer and a liquid layer; and separating the froth layer from a liquid layer, wherein the froth layer comprises the carbon and the liquid layer comprises the precious metal. The remaining solid e-waste can be disposed of or further processed. The froth layer is generated by introducing a gas through the mixture.

The mixture comprising the e-waste, triiodide, at least one frothing agent and at least one collecting agent is preferably agitated, e.g., stirred, as readily understood by the skilled artisan. Flotation can be performed at room temperature in rectangular or cylindrical mechanically agitated cells or tanks, flotation columns, Jameson cells or deinking flotation machines. It should be appreciated that the gas introduced to produce the froth can comprise air, nitrogen, oxygen, argon, helium, carbon dioxide, dinitrogen monoxide, hydrogen, and any combination thereof. Preferably the gas comprises air and the froth is produced by bubbling. It should be appreciated by the skilled artisan that the bubbling rate is easily determined to effectuate the formation of the froth.

Gas can be introduced to the cells, tanks, or columns using fritted tubes. The froth layer can be easily separated from the liquid layer by "skimming" or otherwise scraping the froth off of the liquid layer, as readily understood by the skilled artisan. In addition, the froth layer can be allowed to overflow the rim of the cell or container without skimming or scraping. Following separation of the froth layer from the liquid layer, the froth layer can be processed to reclaim the concentrated carbonaceous material contained therein, and the liquid layer can be processed to reclaim the precious metal. The remaining solid e-waste can be disposed of or further processed. Preferably, the liquid layer is aqueous.

Although not wishing to be bound by theory, the frothing agent is thought to reduce the surface tension of the water to stabilize the rising air bubbles into a layer of foam on which hydrophilic materials, e.g., carbon, collect. The at least one frothing agent is preferably environmentally friendly and comprises formally hydrated terpenes including, but not limited to, terpineols, citronellol, menthol, linalool, borneol, isoborneol, fenchyl alcohol, dihydromyrcenol, nerol, and combinations thereof, as illustrated below. Other frothing agents include methyl isobutyl carbinol (MIBC). The frothing agent preferably is substantially devoid of methyl isobutyl carbinol and other frothing agents derived from non-renewable resources. Preferably, the frothing agent comprises a terpineol.

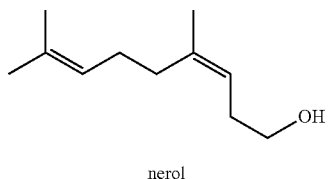

nerol

Although not wishing to be bound by theory, the collecting agent is thought to preferentially adsorb to one of the components in the mixture, e.g., carbon, rendering it more hydrophobic so that it associates with the rising air bubbles. The at least one collecting agent is preferably environmentally friendly and comprises unsaturated hydrocarbon terpenes including, but not limited to, limonene, phellandrenes, terpinenes, pinene, camphene, car-3-ene, sabinene, thujenes, allo-ocimene, ocimenes, myrcene, dihydromyrcene, and combinations thereof, as illustrated below. The collecting agent preferably is substantially devoid of kerosene and other collecting agents derived from non-renewable resources. Preferably, the collecting agent comprises limonene.

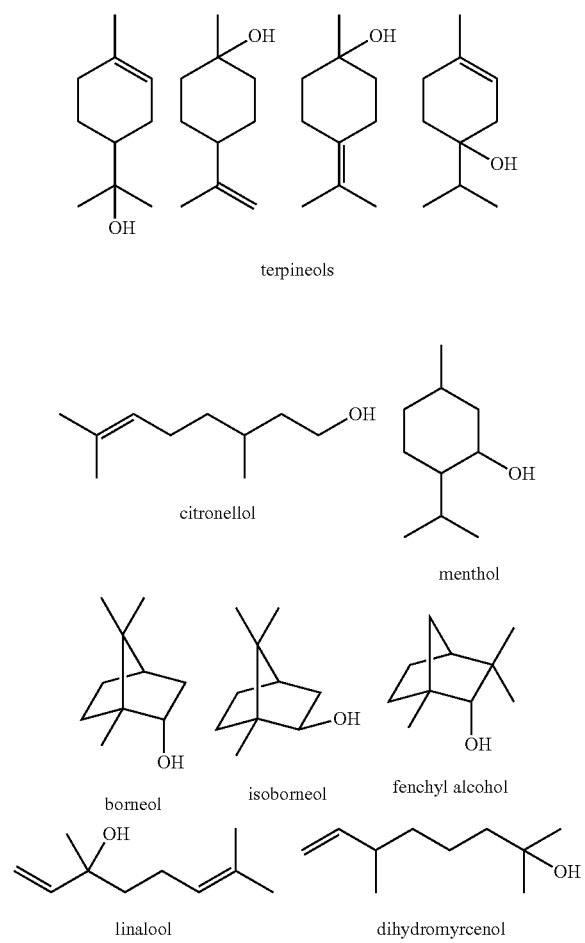

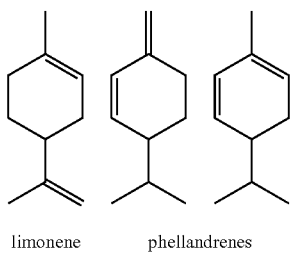

limonene    phellandrenes

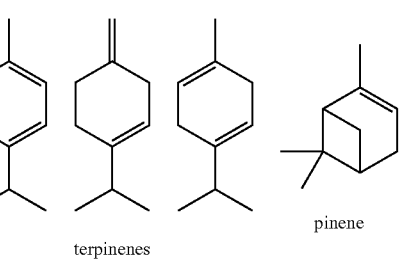

terpinenes    pinene

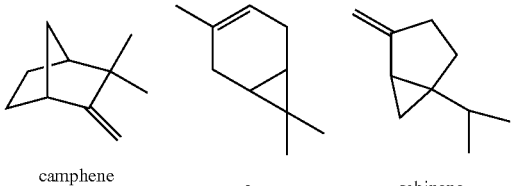

camphene    car-3-ene    sabinene

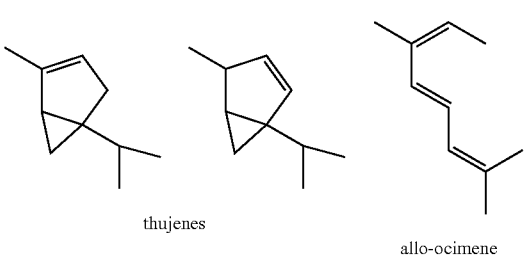

thujenes    allo-ocimene

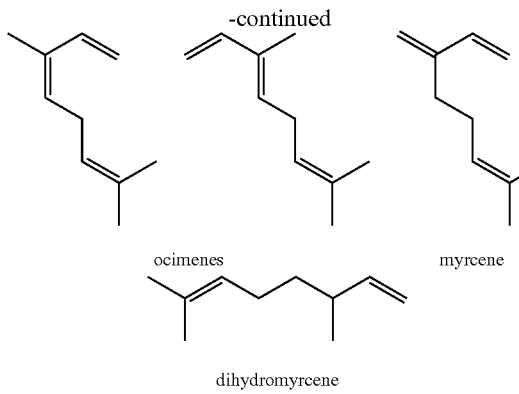

ocimenes  myrcene dihydromyrcene

Preferably, the collecting agent comprises limonene and the frothing agent comprises a terpineol.

Accordingly, in yet another embodiment, an apparatus for recycling a PWB and/or PWB component is described, said apparatus comprising carbon and precious metal removal means comprising:
a precious metal leaching module comprising a container for a leaching composition comprising tri-iodide, at least one frothing agent, and at least one collecting agent;
a rinsing module; and
a drying module.
Preferably, the apparatus is designed such that the PWB and/or PWB component moves automatically or manually from the precious metal leaching module to the rinsing module and to the drying module. In a particularly preferred embodiment, the PWB and/or PWB component moves on a conveyer belt, conveying rollers, or conveying wheels through the apparatus. Preferably, PWB components are pulverized.

In still another embodiment, an apparatus for recycling a PWB and/or PWB component is described, said apparatus comprising carbon and precious metal removal means comprising:
a crushing module;
a precious metal leaching module comprising a container for a leaching composition comprising tri-iodide, at least one frothing agent, and at least one collecting agent;
a rinsing module; and
a drying module.
Preferably, the apparatus is designed such that the PWB and/or PWB component moves automatically or manually from the precious metal leaching module to the rinsing module and to the drying module. In a particularly preferred embodiment, the PWB and/or PWB component moves on a conveyer belt, conveying rollers, or conveying wheels through the apparatus. Preferably, PWB components are pulverized.

The apparatus comprising carbon and precious metal removal means can further comprise a heating module, as described herein, which can be easily incorporated into the apparatus subsequent to the precious metal leaching module.

With regards to the leaching composition, the leaching composition for removing carbon and precious metals from e-waste comprises, consists of, or consists essentially of at least one oxidizing agent, at least one iodide salt or hydroiodic acid, at least one frothing agent, at least one collecting agent, and water. In another embodiment, the leaching composition comprises, consists of, or consists essentially of at least one oxidizing agent, at least one iodide salt or hydroiodic acid, water, at least one frothing agent, at least one collecting agent, and at least one organic solvent.

In still another embodiment, the leaching composition comprises, consists of, or consists essentially of at least one oxidizing agent, at least one iodide salt or hydroiodic acid, water, at least one frothing agent, at least one collecting agent, and at least one metal passivating agent. In still another embodiment, the leaching composition comprises, consists of, or consists essentially of at least one oxidizing agent, at least one iodide salt or hydroiodic acid, water, at least one metal passivating agent, at least one frothing agent, at least one collecting agent, and at least one buffering agent. In still another embodiment, the leaching composition comprises, consists of, or consists essentially of at least one oxidizing agent, at least one iodide salt or hydroiodic acid, water, at least one frothing agent, at least one collecting agent, and at least one surfactant. In yet another embodiment, the leaching composition comprises, consists of, or consists essentially of at least one oxidizing agent, at least one iodide salt or hydroiodic acid, water, at least one organic solvent, at least one frothing agent, at least one collecting agent, and at least one metal passivating agent. In yet another embodiment, the leaching composition comprises, consists of, or consists essentially of at least one oxidizing agent, at least one iodide salt or hydroiodic acid, water, at least one organic solvent, at least one frothing agent, at least one collecting agent, and at least one surfactant. In yet another embodiment, the leaching composition comprises, consists of, or consists essentially of at least one oxidizing agent, at least one iodide salt or hydroiodic acid, water, at least one surfactant, at least one frothing agent, at least one collecting agent, and at least one metal passivating agent. In yet another embodiment, the leaching composition comprises, consists of, or consists essentially of at least one oxidizing agent, at least one iodide salt or hydroiodic acid, water, at least one organic solvent, at least one surfactant, at least one frothing agent, at least one collecting agent, and at least one metal passivating agent. It is understood that the iodide salt or hydroiodic acid and the oxidizing agent present in the leaching composition will react to form iodine in situ and iodide ion will be in excess, resulting in the formation of triiodide. Accordingly, the leaching composition subsequent to the in situ reaction will comprise, consist of, or consist essentially of triiodide, at least one frothing agent, at least one collecting agent, and water. In another embodiment, the leaching composition subsequent to the in situ reaction will comprise, consist of, or consist essentially of triiodide, water, at least one frothing agent, at least one collecting agent, and at least one organic solvent. In still another embodiment, the leaching composition subsequent to the in situ reaction will comprise, consist of, or consist essentially of triiodide, water, at least one frothing agent, at least one collecting agent, and at least one passivating agent. In still another embodiment, the leaching composition subsequent to the in situ reaction will comprise, consist of, or consist essentially of triiodide, water, at least one frothing agent, at least one collecting agent, and at least one surfactant. In yet another embodiment, the leaching composition subsequent to the in situ reaction will comprise, consist of, or consist essentially of triiodide, water, at least one organic solvent, at least one frothing agent, at least one collecting agent, and at least one passivating agent. In yet another embodiment, the leaching composition subsequent to the in situ reaction will comprise, consist of, or consist essentially of triiodide, water, at least one organic solvent, at least one frothing agent, at least one collecting agent, and at least one surfactant. In yet another embodiment, the leaching composition subsequent to the in situ reaction will comprise, consist of, or consist essentially of triiodide, water, at least one surfactant, at least one frothing agent, at least one collecting agent, and at least one passivating agent. In yet another embodiment, the leaching composition subsequent to the in situ reaction will comprise, consist of, or consist essentially of triiodide, water, at least one organic solvent, at least one surfactant, at least one frothing agent, at least one collecting agent, and at least one passivating agent.

Accordingly, in a sixth aspect, a method of removing carbon and at least one precious metal from e-waste is described, said method comprising:
introducing the PWBs and/or PWB components to a leaching composition comprising triiodide, at least one frothing agent, and at least one collecting agent;
generating a froth layer and a liquid layer; and
separating the froth layer from a liquid layer,
wherein the precious metals are substantially removed into the liquid, and the carbon is substantially removed into the froth.

Apparatus and Method for Recycling PWBs

Figure 6:
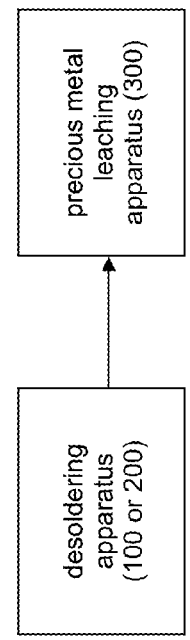
FIG. 6 illustrates the generalized apparatus for recycling printed wire boards.

In a seventh aspect, an apparatus for recycling e-waste, e.g., PWBs is described, said apparatus comprising in general a desoldering apparatus and a precious metal leaching apparatus (see, FIG. 6). The desoldering apparatus can correspond to that of the first or third aspect described herein, although it should be appreciated that other desoldering apparatuses can be used. The precious metal leaching apparatus can correspond to that of the fifth aspect described herein, although it should be appreciated that other precious metal leaching apparatuses can be used. Preferably, the apparatus is designed such that the e-waste, e.g., PWB, crushed IC powders, etc., moves automatically or manually from the desoldering apparatus to the precious metal leaching apparatus. In a particularly preferred embodiment, the e-waste, e.g., PWB, moves on a conveyer belt, conveying rollers, or conveying wheels through the apparatus. Preferably, the desoldering apparatus and the precious metal leaching apparatus are attached such that the e-waste moves automatically and contiguously from one to the other.

In one embodiment of the seventh aspect, an apparatus for recycling e-waste comprises:
a mechanical solder removal module;
a chemical solder removal module;
a rinsing module;
a drying module;
a precious metal leaching module;
a rinsing module; and
a drying module.
Preferably, the apparatus is designed such that the e-waste moves automatically or manually module to module. In a particularly preferred embodiment, the e-waste moves on a conveyer belt, conveying rollers, or conveying wheels through the apparatus. Preferably, the modules are attached such that the e-waste moves automatically and contiguously from one to the other. In a particularly preferred embodiment, the e-waste comprises PWBs and the precious metals comprise gold.

In another embodiment of the seventh aspect, an apparatus for recycling e-waste comprises:
a mechanical solder removal module, comprising at least one blade and at least one agitator for the mechanical removal of solder from the surface;
a chemical solder removal module comprising a container for a first composition and at least one agitator, wherein the PWB is partially immersed in the first composition;
a rinsing module;
a drying module;
a precious metal leaching module comprising a container for a leaching composition comprising tri-iodide;
a rinsing module; and
a drying module.
Preferably, the apparatus is designed such that the e-waste moves automatically or manually module to module. In a particularly preferred embodiment, the e-waste moves on a conveyer belt, conveying rollers, or conveying wheels through the apparatus. Preferably, the modules are attached such that the e-waste moves automatically and contiguously from one to the other. In a particularly preferred embodiment, the e-waste comprises PWBs and the precious metals comprise gold. Preferably, the agitator comprises at least one brush, rake, or blown gases or liquids.

In yet another embodiment of the seventh aspect, an apparatus for recycling e-waste comprises:
a mechanical solder removal module;
a chemical solder removal module;
a heating module;
a rinsing module;
a drying module;
optionally, a crushing module;
a precious metal leaching module;
a rinsing module; and
a drying module.
Preferably, the apparatus is designed such that the e-waste moves automatically or manually module to module. In a particularly preferred embodiment, the e-waste moves on a conveyer belt, conveying rollers, or conveying wheels through the apparatus. Preferably, the modules are attached such that the e-waste moves automatically and contiguously from one to the other. In a particularly preferred embodiment, the e-waste comprises PWBs and the precious metals comprise gold. It is contemplated that subsequent to the heating module that the e-waste can be re-introduced to the chemical solder remover, the rinsing module, and the drying module, as shown as an option in FIG. 3 and described herein. When present, the crushing module includes, but is not limited to, means for pulverizing, means for shredding, and means for crushing the PWB and/or PWB components so that the hard shell (e.g., plastic) is cracked, as readily determined by the person skilled in the art.

In still another embodiment of the seventh aspect, an apparatus for recycling e-waste comprises:
a mechanical solder removal module, comprising at least one blade and at least one agitator for the mechanical removal of solder from the surface;
a chemical solder removal module comprising a container for a first composition and at least one agitator, wherein the PWB is partially immersed in the first composition;
a heating module;
a rinsing module;
a drying module;
optionally, a crushing module;
a precious metal leaching module comprising a container for a leaching composition comprising tri-iodide;
a rinsing module; and
a drying module.
Preferably, the apparatus is designed such that the e-waste moves automatically or manually module to module. In a particularly preferred embodiment, the e-waste moves on a conveyer belt, conveying rollers, or conveying wheels through the apparatus. Preferably, the modules are attached such that the e-waste moves automatically and contiguously from one to the other. In a particularly preferred embodiment, the e-waste comprises PWBs and the precious metals comprise gold. It is contemplated that subsequent to the heating module that the e-waste can be re-introduced to the chemical solder remover, the rinsing module, and the drying module, as shown as an option in FIG. 3 and described herein. When present, the crushing module includes, but is not limited to, means for pulverizing, means for shredding, and means for crushing the PWB and/or PWB components so that the hard shell (e.g., plastic) is cracked, as readily determined by the person skilled in the art. Preferably, the agitator comprises at least one brush, rake, or blown gases or liquids.

In another embodiment of the seventh aspect, an apparatus for recycling e-waste comprises:
a mechanical solder removal module;
a chemical solder removal module;
optionally, a heating module;
a rinsing module;
a drying module;
a crushing module;
a precious metal leaching module;
a rinsing module; and
a drying module.

Preferably, the apparatus is designed such that the e-waste moves automatically or manually module to module. In a particularly preferred embodiment, the e-waste moves on a conveyer belt, conveying rollers, or conveying wheels through the apparatus. Preferably, the modules are attached such that the e-waste moves automatically and contiguously from one to the other. In a particularly preferred embodiment, the e-waste comprises PWBs and the precious metals comprise gold. When present, it is contemplated that subsequent to the heating module that the e-waste can be re-introduced to the chemical solder remover, the rinsing module, and the drying module, as shown as an option in FIG. 3 and described herein. The crushing module includes, but is not limited to, means for pulverizing, means for shredding, and means for crushing the PWB and/or PWB components so that the hard shell (e.g., plastic) is cracked, as readily determined by the person skilled in the art.

In still another embodiment of the seventh aspect, an apparatus for recycling e-waste comprises:
a mechanical solder removal module, comprising at least one blade and at least one agitator for the mechanical removal of solder from the surface;
a chemical solder removal module comprising a container for a first composition and at least one agitator, wherein the PWB is partially immersed in the first composition;
optionally, a heating module;
a rinsing module;
a drying module;
a crushing module;
a precious metal leaching module comprising a container for a leaching composition comprising tri-iodide;
a rinsing module; and
a drying module.

Preferably, the apparatus is designed such that the e-waste moves automatically or manually module to module. In a particularly preferred embodiment, the e-waste moves on a conveyer belt, conveying rollers, or conveying wheels through the apparatus. Preferably, the modules are attached such that the e-waste moves automatically and contiguously from one to the other. In a particularly preferred embodiment, the e-waste comprises PWBs and the precious metals comprise gold. When present, it is contemplated that subsequent to the heating module that the e-waste can be re-introduced to the chemical solder remover, the rinsing module, and the drying module, as shown as an option in FIG. 3 and described herein. The crushing module includes, but is not limited to, means for pulverizing, means for shredding, and means for crushing the PWB and/or PWB components so that the hard shell (e.g., plastic) is cracked, as readily determined by the person skilled in the art. Preferably, the agitator comprises at least one brush, rake, or blown gases or liquids.

In still another embodiment of the seventh aspect, an apparatus for recycling e-waste comprises:
a heating module, comprising a heating mechanism and means for moving the waste PWBs through the heating mechanism;
a chemical solder removal module comprising a container for a first composition and at least one agitator, wherein the PWB is partially immersed in the first composition;
a rinsing module;
a drying module;
a precious metal leaching module comprising a container for a leaching composition comprising tri-iodide;
a rinsing module; and
a drying module.

Preferably, the apparatus is designed such that the e-waste moves automatically or manually module to module. In a particularly preferred embodiment, the e-waste moves on a conveyer belt, conveying rollers, or conveying wheels through the apparatus. Preferably, the modules are attached such that the e-waste moves automatically and contiguously from one to the other. In a particularly preferred embodiment, the e-waste comprises PWBs and the precious metals comprise gold. Preferably, the heating module comprises agitation means comprising brushes and the means for moving the waste PWBs through the heating mechanism comprises a roller chain. The waste PWB can be hung from the roller chain using clips or other clamping means. In a particular preferred embodiment, the heating mechanism is maintained at least 1° C. to about 20° C. below the melting point of the solder or epoxy.

In yet another embodiment of the seventh aspect, an apparatus for recycling e-waste comprises:
a heating module, comprising a heating mechanism and means for moving the waste PWBs through the heating mechanism;
a chemical solder removal module comprising a container for a first composition and at least one agitator, wherein the PWB is partially immersed in the first composition;
a rinsing module;
a drying module;
a crushing module;
a precious metal leaching module comprising a container for a leaching composition comprising tri-iodide;
a rinsing module; and
a drying module.

Preferably, the apparatus is designed such that the e-waste moves automatically or manually module to module. In a particularly preferred embodiment, the e-waste moves on a conveyer belt, conveying rollers, or conveying wheels through the apparatus. Preferably, the modules are attached such that the e-waste moves automatically and contiguously from one to the other. In a particularly preferred embodiment, the e-waste comprises PWBs and the precious metals comprise gold. The crushing module includes, but is not limited to, means for pulverizing, means for shredding, and means for crushing the PWB and/or PWB components so that the hard shell (e.g., plastic) is cracked, as readily determined by the person skilled in the art. Preferably, the heating module comprises agitation means comprising brushes and the means for moving the waste PWBs through the heating mechanism comprises a roller chain. The waste PWB can be hung from the roller chain using clips or other clamping means. In a particular preferred embodiment, the heating mechanism is maintained at least 1° C. to about 20° C. below the melting point of the solder or epoxy.

Regardless of which embodiment of the seventh aspect is used, consistent with the disclosures herein, the solder can comprise lead, tin, or a combination of lead and tin. Preferably, the e-waste comprises a surface which includes a PWB and the recyclable material comprises components (e.g., ICs), precious metals, base metals, or any combination of components, precious metals and base metals. The released components can be collected and can be separated into those that are reusable and can be resold and those that can be further processed for disposal, reclamation of useful materials, etc. The first composition preferably selectively removes solder (e.g., lead, tin, alloys thereof, and combinations thereof) relative to precious metals, and/or base metals, and the components that are liberated following removal of the solder are readily collected and sorted for reuse or reclamation purposes. Subsequent to solder removal, the first composition, which includes lead and/or tin ions, can be subjected to further processing (e.g., electrowinning) to reclaim the lead and/or tin. Preferably, prior to introducing to the precious metal leaching module, the e-waste is crushed. Subsequent to leaching, the gold can be precipitated as described herein. The conditions of contact (i.e., time and temperature) were introduced herein. Advantageously, the apparatus allows a user to take obsolete and used printed wire boards and recycle the electronic components and metals contained thereon for reuse.

In an eighth aspect, a method of recycling e-waste is described, said method comprising:
removing at least a portion of the solder using a mechanical solder remover;
removing at least a portion of the solder using a chemical solder remover; and
removing at least a portion of a precious metal using a leaching composition.
The process can further comprise rinsing and drying of the e-waste. Preferably, the e-waste comprises a PWB.

In one embodiment of the eighth aspect, a method of recycling e-waste is described, said method comprising:
removing at least a portion of the solder using a mechanical solder remover, wherein the mechanical solder remover comprises at least one blade and at least one agitator for the mechanical removal of solder from the surface;
removing at least a portion of the solder using a chemical solder remover, wherein the chemical solder remover comprises a container for a first composition and at least one agitator, wherein the PWB is partially immersed in the first composition; and
removing at least a portion of a precious metal using a leaching composition.
The process can further comprise rinsing and drying of the e-waste. Preferably, the e-waste comprises a PWB. Preferably, the agitator comprises at least one brush, rake, or blown gases or liquids.

In yet another embodiment of the eighth aspect, a method for recycling e-waste comprises:
removing at least a portion of the solder using a mechanical solder remover;
removing at least a portion of the solder using a chemical solder remover;
removing epoxy-covered components using heating means; and
removing at least a portion of a precious metal using a leaching composition.

The process can further comprise rinsing and drying of the e-waste. Preferably, the e-waste comprises a PWB. Preferably, the mechanical solder remover comprises at least one blade and at least one agitator for the mechanical removal of solder from the surface of the e-waste. Preferably, the chemical solder remover comprises a container for a first composition and at least one agitator, wherein the e-waste is partially immersed in the first composition. Preferably, the agitator comprises at least one brush, rake, or blown gases or liquids.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:
1. A process for recovering at least one precious metal from printed wire boards (PWB) and/or PWB components, the process comprising,
(a) heating the PWBs in a heating module to soften solder, adhesives, epoxy, and/or glue to remove the PWB components and/or casing from the PWBs;
(b) removing at least a portion of the solder from the PWBs and/or PWB components using a chemical solder removal composition in a chemical solder removal module;
(c) contacting the PWBs and/or PWB components with a leaching composition in a precious metal leaching module to extract at least a portion of the at least one precious metal from the PWBs and/or PWB components into the leaching composition, wherein the at least one precious metal is substantially dissolved or solubilized in the leaching composition;
(d) isolating the leaching composition from the PWBs and/or PWB components;
(e) rinsing the PWBs and/or PWB components in a rinsing module; and
(f) drying the PWBs and/or PWB components in a drying module.
2. The process of claim 1, further comprising recovering the at least one precious metal from the isolated leaching composition.
3. The process of claim 1, wherein the precious metal leaching module, the rinsing module and the drying module are in series.
4. The process of claim 1, wherein the PWBs and/or PWB components moves manually or automatically from the precious metal leaching module to the rinsing module and to the drying module.
5. The process of claim 4, wherein the PWBs and/or PWB components moves manually or automatically on a conveyer belt, conveying roller or conveying wheel.
6. The process of claim 1, further comprising crushing the PWBs and/or PWB components in a crushing module prior to contacting in the precious metal leaching module.
7. The process of claim 1, wherein the isolated leaching composition comprises precious metal ions.
8. The process of claim 2, wherein the recovery of the at least one precious metal from the isolated leaching composition comprises reducing, electrowinning or electrochemically converting the precious metal ions to precious metal.

9. The process of claim 8, further comprising precipitating the at least one precious metal after reduction, electrowinning or electrochemical conversion.

10. The process of claim 1, wherein the isolation comprises filtering and/or centrifuging and/or decanting the leaching composition from the PWBs and/or PWB components.

11. The process of claim 1, wherein the leaching composition substantially leaches at least one precious metal from the PWBs and/or PWB components.

12. The process of claim 1, wherein the leaching composition is purified and recycled.

13. The process of claim 1, wherein the heating module comprises means for moving the PWBs and/or PWB components through a heating mechanism, wherein the means for moving comprise a roller chain, tracks, belts, or link chains.

14. The process of claim 1, wherein the heating module comprises agitation means for removing the PWB components and/or casing from the PWBs once the solder, adhesives, epoxy, and/or glue is softened, wherein the agitation means are selected from the group consisting of brushes, pressurized gases, pressurized liquids, rakes, sonic energy and laser energy.

15. The process of claim 1, wherein the PWB components comprises at least one of a transistor, a capacitor, a heat sink, an integrated circuit, a resistor, an integrated switch, and a processor.

16. The process of claim 1, wherein the leaching composition comprises a salt brine/acid mixture.

17. The process of claim 1, further comprising inserting the PWBs and/or PWB components into a drum prior to removing at least a portion of the solder from the PWBs and/or PWB components.

18. The process of claim 17, wherein the drum is agitated such that the chemical solder removal composition flows past the surface of the PWBs and/or PWB components.

19. The process of claim 1, wherein the rinsing is effectuated by spraying a rinsing composition on the PWBs and/or PWB components, dipping the PWBs and/or PWB components in a volume of the rinsing composition, contacting the PWBs and/or PWB components with a pad or fibrous sorbent applicator element having the rinsing composition absorbed thereon, or contacting the PWBs and/or PWB components with the rinsing composition that is recirculating.

20. The process of claim 19, wherein the rinsing composition comprises water.

21. The process of claim 1, wherein the PWBs and/or PWB components are dried using nitrogen gas, isopropanol, regenerative air, hot air, or spin process technology.

22. The process of claim 1, wherein the chemical solder removal composition selectively removes lead and/or tin-containing solder from the PWBs and/or PWB components relative to precious metals, tantalum-containing metals, and/or base metals that are simultaneously present on said PWBs and/or PWB components.

23. The process of claim 1, wherein the chemical solder removal composition comprises at least one oxidizing agent.

24. The process of claim 1, wherein the chemical solder removal composition comprises nitric acid.

25. The process of claim 1, wherein the heating module comprises a heating mechanism that is maintained at least 1° C. to about 20° C. below the melting point of the solder and/or epoxy.

26. The process of claim 1, wherein the at least one precious metal comprises a species selected from the group consisting of gold, silver, platinum, palladium, rhodium, iridium, osmium, rhenium, ruthenium and alloys comprising same.

27. The process of claim 1, wherein the leaching composition comprises at least one oxidizing agent selected from the group consisting of nitric acid, cyclohexylaminosulfonic acid, hydrogen peroxide, potassium peroxymonosulfate, ammonium peroxomonosulfate, ammonium chlorite, ammonium chlorate, ammonium iodate, ammonium perborate, ammonium perchlorate, ammonium periodate, ammonium persulfate, ammonium hypochlorite, sodium persulfate, sodium hypochlorite, potassium iodate, potassium permanganate, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, urea hydrogen peroxide, peracetic acid, sodium nitrate, potassium nitrate, ammonium nitrate, sulfuric acid, methanesulfonic acid, ethanesulfonic acid, 2-hydroxyethanesulfonic acid, n-propanesulfonic acid, isopropanesulfonic acid, isobutenesulfonic acid, n-butanesulfonic acid, n-octanesulfonic acid, benzenesulfonic acid, 4-methoxybenzenesulfonic acid, 4-hydroxybenzenesulfonic acid, 4-aminobenzenesulfonic acid, 4-nitrobenzenesulfonic acid, toluenesulfonic acid, hexylbenzenesulfonic acid, heptylbenzenesulfonic acid, octylbenzenesulfonic acid, nonylbenzenesulfonic acid, decylbenzenesulfonic acid, undecylbenzenesulfonic acid, dodecylbenzenesulfonic acid, tridecylbenzenesulfonic acid, tetradecylbenzene sulfonic acid, hexadecylbenzene sulfonic acid, 3-nitrobenzenesulfonic acid, 2-nitrobenzenesulfonic acid, 2-nitronaphthalenesulfonic acid, 3-nitronaphthalenesulfonic acid, 2,3-dinitrobenzenesulfonic acid, 2,4-dinitrobenzenesulfonic acid, 2,5-dinitrobenzenesulfonic acid, 2,6-dinitrobenzenesulfonic acid, 3,5-dinitrobenzenesulfonic acid, 2,4,6-trinitrobenzenesulfonic acid, 3-aminobenzenesulfonic acid, 2-aminobenzenesulfonic acid, 2-aminonaphthalenesulfonic acid, 3-aminonaphthalenesulfonic acid, 2,3-diaminobenzenesulfonic acid, 2,4-diaminobenzenesulfonic acid, 2,5-diaminobenzenesulfonic acid, 2,6-diaminobenzenesulfonic acid, 3,5-diaminobenzenesulfonic acid, 2,4,6-triaminobenzenesulfonic acid, 3-hydroxybenzenesulfonic acid, 2-hydroxybenzenesulfonic acid, 2-hydroxynaphthalenesulfonic acid, 3-hydroxynaphthalenesulfonic acid, 2,3-dihydroxybenzenesulfonic acid, 2,4-dihydroxybenzenesulfonic acid, 2,5-dihydroxybenzenesulfonic acid, 2,6-dihydroxybenzenesulfonic acid, 3,5-dihydroxybenzenesulfonic acid, 2,3,4-trihydroxybenzenesulfonic acid, 2,3,5-trihydroxybenzenesulfonic acid, 2,3,6-trihydroxybenzenesulfonic acid, 2,4,5-trihydroxybenzenesulfonic acid, 2,4,6-trihydroxybenzenesulfonic acid, 3,4,5-trihydroxybenzenesulfonic acid, 2,3,4,5-tetrahydroxybenzenesulfonic acid, 2,3,4,6-tetrahydroxybenzenesulfonic acid, 2,3,5,6-tetrahydroxybenzenesulfonic acid, 2,4,5,6-tetrahydroxybenzenesulfonic acid, 3-methoxybenzenesulfonic acid, 2-methoxybenzenesulfonic acid, 2,3-dimethoxybenzenesulfonic acid, 2,4-dimethoxybenzenesulfonic acid, 2,5-dimethoxybenzenesulfonic acid, 2,6-dimethoxybenzenesulfonic acid, 3,5-dimethoxybenzenesulfonic acid, 2,4,6-trimethoxybenzenesulfonic acid, and combinations thereof.

28. The process of claim 27, wherein the first composition further comprises at least one lead and/or tin complexing agent, at least one organic solvent, and/or at least one passivating agent.

29. The process of claim 28, comprising the at least one complexing agent, wherein the at least one complexing agent comprises a species selected from the group consisting of glycine, serine, proline, leucine, alanine, asparagine, aspartic acid, glutamine, valine, lysine, citric acid, acetic acid, maleic acid, oxalic acid, malonic acid, succinic acid, phosphonic acid, hydroxyethylidene diphosphonic acid (HEDP), 1-hydroxyethane-1,1-diphosphonic acid, nitrilo-tris(methylenephosphonic acid), nitrilotriacetic acid, iminodiacetic acid, etidronic acid, ethylenediamine, ethylenediaminetetraacetic acid (EDTA), (1,2-cyclohexylenedinitrilo) tetraacetic acid (CDTA), uric acid, tetraglyme, pentamethyldiethylenetriamine (PMDETA), 1,3,5-triazine-2,4,6-thithiol trisodium salt solution, 1,3,5-triazine-2,4,6-thithiol triammonium salt solution, sodium diethyldithiocarbamate, disubstituted dithiocarbamates ammonium sulfate, monoethanolamine (MEA), Dequest 2000, Dequest 2010, Dequest 2060s, diethylenetriamine pentaacetic acid, propylenediamine tetraacetic acid, 2-hydroxypyridine 1-oxide, ethylendiamine disuccinic acid (EDDS), N-(2-hydroxyethyl) iminodiacetic acid (HEIDA), sodium triphosphate penta basic, ammonium chloride, sodium chloride, lithium chloride, potassium chloride, ammonium sulfate, hydrochloric acid, sulfuric acid, and combinations thereof.

30. The process of claim 27, wherein the leaching composition is substantially devoid of at least one of fluoride salts, ferric nitrate and other ferric salts, titanium (IV) salts, abrasive material, and fluoroboric acid.

* * * * *